US011514537B2

(12) United States Patent
Lu et al.

(10) Patent No.: US 11,514,537 B2
(45) Date of Patent: Nov. 29, 2022

(54) DECOUPLED MODELING METHODS AND SYSTEMS

(71) Applicants: TOTAL SOLAR INTERNATIONAL, Courbevoie (FR); NORTH CAROLINA STATE UNIVERSITY, Raleigh, NC (US)

(72) Inventors: Jian Lu, Raleigh, NC (US); Jiyu Wang, Raleigh, NC (US); Ning Lu, Raleigh, NC (US); Wente Zeng, Courbevoie (FR)

(73) Assignees: TOTAL SOLAR INTERNATIONAL, Courbevoie (FR); NORTH CAROLINA STATE UNIVERSITY, Raleigh, NC (US)

(*) Notice: Subject to any disclaimer, the term of this patent is extended or adjusted under 35 U.S.C. 154(b) by 208 days.

(21) Appl. No.: 16/754,267

(22) PCT Filed: Oct. 9, 2017

(86) PCT No.: PCT/US2017/055743
§ 371 (c)(1),
(2) Date: Apr. 7, 2020

(87) PCT Pub. No.: WO2019/074475
PCT Pub. Date: Apr. 18, 2019

(65) Prior Publication Data
US 2020/0302561 A1    Sep. 24, 2020

(51) Int. Cl.
*G06Q 50/06*    (2012.01)
*F24F 11/63*    (2018.01)
(Continued)

(52) U.S. Cl.
CPC .............. *G06Q 50/06* (2013.01); *F24F 11/46* (2018.01); *F24F 11/63* (2018.01); *G01R 22/061* (2013.01);
(Continued)

(58) Field of Classification Search
CPC ....... G06Q 50/06; G06Q 50/163; F24F 11/46; F24F 11/63; F24F 2140/60; G01R 22/061; G01R 22/10; G05B 13/042
See application file for complete search history.

(56) References Cited

U.S. PATENT DOCUMENTS 4,123,792 A * 10/1978 Gephart ............... G01R 31/343
62/154
7,089,129 B2 * 8/2006 Habitz .................. G06F 30/367
702/65
(Continued)

FOREIGN PATENT DOCUMENTS

CN          105627506 A      6/2016
WO    WO 2015/061271 A1    4/2015
WO    WO 2015/183242 A1    12/2015

OTHER PUBLICATIONS

International Search Report and Written Opinion dated Mar. 2, 3018 in PCT/US2017/055743 filed on Oct. 9, 2017.
(Continued)

*Primary Examiner* — Tung S Lau
(74) *Attorney, Agent, or Firm* — Oblon, McClelland, Maier & Neustadt, L.L.P.

(57) ABSTRACT

A decoupled ETP model processor is configured to store power consumption data retrieved from power systems; convert the power consumption data into power activated time cycles and power non-activated time cycles; derive a thermal resistance (R) parameter and a capacitance (C) parameter for a predetermined heat flow (Q) parameter at each of the outdoor temperatures; compare the converted (Continued)

power activated time cycles to the actual power activated time cycles; compare the converted power non-activated time cycles to the actual power non-activated time cycles; calculate a first improved resistance-capacitance-heat flow (RCQ) parameter set and a respective first outdoor temperature for the compared and converted power activated time cycles to the actual power activated time cycles; calculate the Q parameter at each outdoor temperature during the power activated time cycles; and calculate the R parameter and the C parameter at each outdoor temperature during the power non-activated time cycles.

20 Claims, 19 Drawing Sheets

(51) Int. Cl.
<br>*F24F 11/46* (2018.01)
<br>*G01R 22/06* (2006.01)
<br>*G01R 22/10* (2006.01)
<br>*G05B 13/04* (2006.01)
<br>*G06Q 50/16* (2012.01)
<br>*F24F 140/60* (2018.01)

(52) U.S. Cl.
<br>CPC ........... *G01R 22/10* (2013.01); *G05B 13/042* (2013.01); *G06Q 50/163* (2013.01); *F24F 2140/60* (2018.01)

(56) References Cited

U.S. PATENT DOCUMENTS

| | | | |
|---|---|---|---|
| 9,870,009 B2* | 1/2018 | Erwin | H01H 9/20 |
| 2004/0095024 A1* | 5/2004 | Okamoto | F42B 3/04 |
| | | | 307/100 |
| 2005/0102117 A1* | 5/2005 | Habitz | G06F 30/367 |
| | | | 702/133 |
| 2007/0025042 A1* | 2/2007 | Nishikawa | H01H 37/761 |
| | | | 361/104 |
| 2013/0282181 A1 | 10/2013 | Lu et al. | |
| 2014/0225455 A1* | 8/2014 | Erwin | G05D 23/19 |
| | | | 307/109 |
| 2015/0248118 A1 | 9/2015 | Li et al. | |
| 2015/0346741 A1 | 12/2015 | Murthy | |
| 2016/0041112 A1* | 2/2016 | Pan | G01N 25/20 |
| | | | 702/136 |
| 2016/0098639 A1 | 4/2016 | Choe et al. | |
| 2016/0261116 A1 | 9/2016 | Barooah et al. | |

OTHER PUBLICATIONS

Combined Chinese Office Action and Search Report dated Jan. 6, 2021, in Chinese Patent Application No. 201780096382.4 (with English translation of Categories of Cited Documents), 17 pages.
European Office Action dated Nov. 25, 2021 in European Patent Application No. 17794455.0, 6 pages.

* cited by examiner

DECOUPLED MODELING METHODS AND SYSTEMS

BACKGROUND

Thermostatically controlled appliances (TCA) such as heating, ventilation, and air conditioning (HVAC) units, and water heaters are commonly used as load-side resources for demand response programs and home energy management (HEM) systems. To control the electricity consumption of a TCA unit without tempering user comfort, an equivalent thermal parameter (ETP) model of the TCA unit is normally needed to forecast the ON/OFF status of the unit for a few hours. The ETP model uses the thermostat set point, outdoor temperature, and an initial room temperature as inputs to predict the subsequent ON/OFF cycles.

In Ruzzelli et al. load detection methods are proposed based on signal processing methods such as signal extraction, neural networks, spectrum analysis, V-1 trajectory, and wavelet transforms. However, these methods are used for detecting the loads instead of deriving a model that can forecast the load behaviors in subsequent intervals. See A. G. Ruzzelli, C. Nicolas, A. Schoofs and G. M. P. O'Hare, "Real-Time Recognition and Profiling of Appliances through a Single Electricity Sensor," 2010 7th Annual IEEE Communications Society Conference on Sensor, Mesh and Ad Hoc Communications and Networks (SECON), Boston, Mass., 2010, pp. 1-9; S. Makonin, F. Popowich, L. Bartram, B. Gill and I. V. Bajić, "AMPds: A public dataset for load disaggregation and eco-feedback research," 2013 IEEE Electrical Power & Energy Conference, Halifax, N S, 2013, pp. 1-6; M. Weiss, A. Helfenstein, F. Mattern and T. Staake, "Leveraging smart meter data to recognize home appliances," 2012 IEEE International Conference on Pervasive Computing and Communications, Lugano, 2012, pp. 190-197; M. Dong, P. C. M. Meira, W. Xu and C. Y. Chung, "Non-Intrusive Signature Extraction for Major Residential Loads," in IEEE Transactions on Smart Grid, vol. 4, no. 3, pp. 1421-1430, September 2013; A. I. Cole and A. Albicki, "Data extraction for effective non-intrusive identification of residential power loads," IMTC/98 Conference Proceedings. IEEE Instrumentation and Measurement Technology Conference. St. Paul, Minn., 1998, pp. 812-815 vol. 2; and H. Najmeddine et al., "State of art on load monitoring methods," 2008 IEEE 2nd International Power and Energy Conference, Johor Bahru, 2008, pp. 1256-1258, each incorporated herein by reference in their entireties.

For residential applications, researchers normally apply first or second order differential equations to represent the thermal dynamics of a single-family household when outdoor temperature changes. See S. Katipamula and N. Lu, "Evaluation of residential HVAC control strategies for demand response programs," ASHRAE Trans., vol. 1, no. 12, pp. 1-12, 2006, incorporated herein by reference in its entirety. The ETP model parameters are derived from a physics-based approach or a measurement-based approach.

The physics-based methods usually model the house in detail. See S. Shao, M. Pipattanasomporn and S. Rahman, "Development of physical-based demand response-enabled residential load models," in IEEE Transactions on Power Systems, vol. 28, no. 2, pp. 607-614, May 2013; S. Ihara and F. C. Schweppe, "Physically based modeling of cold load pickup," IEEE Trans. Power App. Syst., vol. PAS-100, no. 9, pp. 4142-4150, September 1981; E. Agneholm and J. Daalder, "Cold load pick-up of residential load," Proc. Inst. Elect. Eng., Gen., Transm., Distrib., vol. 147, no. 1, pp. 44-50, January 2000; J. Yan, Q. Zeng, Y. Liang, L. He and Z. Li, "Modeling and Implementation of Electroactive Smart Air-Conditioning Vent Register for Personalized HVAC Systems," in IEEE Access, to be published, doi: 10.1109/ACCESS.2017.2664580; A. Gomes, C. H. Antunes, and A. G. Martins, "Physically-based load demand models for assessing electric load control actions," in Proc. IEEE Bucharest PowerTech, July 2009; and R. E. Mortensen and K. P. Haggerty, "A stochastic computer model for heating and cooling loads," IEEE Trans. Power Syst., vol. 3, no. 3, pp. 1213-1219, August 1988, each incorporated herein by reference in their entireties. The inputs include the material and thickness of the walls, the size and number of windows, the thermal mass in the houses, the facing of the house, etc. This type of approach is usually used for modeling a typical residential house. When modeling an actual house for the HEM control purpose, it is impractical because many unforeseeable factors, such as construction material variations, tree covers, and vent locations can have a significant impact on the accuracy of the model.

Measurement-based methods have been used to overcome some of the deficiencies of physics-based methods to derive the ETP parameters. In Lu, N. Lu proposed a data-driven HVAC model in which the parameters are derived from curve-fitting the HVAC consumption curves. See N. Lu, "An evaluation of the HVAC load potential for providing load balancing service," IEEE Trans. Smart Grid, vol. 3, no. 3, pp. 1263-1270, September 2012, incorporated herein by reference in its entirety. To account for the impact of outdoor temperature, an adjustment can be made using a look-up table that contains a set of HVAC parameters under each temperature range. However, this data-driven model was derived and tested primarily using the HVAC consumption data produced by higher-order physics-based ETP models because sub-metered high-resolution HVAC consumption data was not available. The accuracy of the model was not satisfactory during validation using metered one-minute HVAC consumptions.

The "background" description provided herein is for the purpose of generally presenting the context of the disclosure. Work of the presently named inventors, to the extent it is described in this background section, as well as aspects of the description which may not otherwise qualify as conventional at the time of filing, are neither expressly nor impliedly admitted as conventional against the present disclosure.

SUMMARY

Embodiments described herein include the following aspects.

(1) A method of improving an energy parameter estimation includes storing power consumption data retrieved from a plurality of power systems into a power consumption database; converting, via processing circuitry, the power consumption data into power activated time cycles and power non-activated time cycles; calculating, via the processing circuitry, median time values of the power activated time cycles and the power non-activated time cycles for respective outdoor temperatures; deriving a thermal resistance (R) parameter and a capacitance (C) parameter for a predetermined heat flow (Q) parameter at each of the respective outdoor temperatures for the plurality of power systems; comparing, via the processing circuitry, the converted power activated time cycles to the actual power activated time cycles for the plurality of power systems; comparing, via the processing circuitry, the converted power non-activated time cycles to the actual power non-activated time cycles for the plurality of power systems; calculating a first improved resistance-capacitance-heat flow (RCQ) parameter set and a respective first outdoor temperature for the compared and converted power activated time cycles to the actual power activated time cycles; calculating a second improved RCQ parameter set and a respective second outdoor temperature for the compared and converted power non-activated time cycles to the actual power non-activated time cycles; and improving the energy parameter estimation by executing the first and second improved RCQ parameter sets at the respective first and second outside temperatures for each of the plurality of power systems, wherein the improving the energy parameter estimation identifies energy efficiencies to reduce a total energy load within said each of the plurality of power systems.

(2) The method of improving an energy parameter estimation of (1), wherein the improved RCQ parameter set is determined by minimizing an error between the converted power activated time cycles and the actual power activated time cycles, and between the converted power non-activated time cycles and the actual power non-activated time cycles.

(3) The method of improving an energy parameter estimation of either (1) or (2), wherein the power consumption data is limited to data within a temperature range between a predefined upper limit temperature and a predefined lower limit temperature.

(4) The method of improving an energy parameter estimation of any one of (1) through (3), wherein the method comprises an equivalent thermal parameter (ETP) model for improving the energy parameter estimation.

(5) The method of improving an energy parameter estimation of any one of (1) through (4), further includes calculating the Q parameter at each of the respective outdoor temperatures during the power activated time cycles for the plurality of power systems; and calculating the R parameter and the C parameter at each of the respective outdoor temperatures during the power non-activated time cycles for the plurality of power systems.

(6) The method of improving an energy parameter estimation of any one of (1) through (5), further includes calculating, via the processing circuitry, an estimated duration of each of the power activated time cycles from the Q parameter calculated at each of the respective outdoor temperatures; calculating, via the processing circuitry, an estimated duration of each of the power non-activated time cycles from the R parameter and the C parameter calculated at each of the respective outdoor temperatures; and improving the energy parameter estimation to reduce errors corresponding to variations in said each of the respective outdoor temperatures by decoupling daytime parameters from night time parameters via the estimated duration of said each of the power activated time cycles from the Q parameter and via the estimated duration of said each of the power non-activated time cycles from the R parameter and the C parameter.

(7) The method of improving an energy parameter estimation of any one of (1) through (6), further includes calculating an R adjustment coefficient as a ratio of a whole-day R parameter to a night-time R parameter, calculating a C adjustment coefficient as a ratio of a whole-day C parameter to a night-time C parameter; calculating a Q adjustment coefficient at said each of the respective outdoor temperatures as a ratio of a whole-day Q parameter to a night-time Q parameter at said each of the respective outdoor temperatures; and calculating an RC adjustment coefficient at said each of the respective outdoor temperatures as a ratio of a whole-day RC parameter to a night-time RC parameter at said each of the respective outdoor temperatures; wherein the whole-day R parameter, the whole-day C parameter, the whole-day Q parameter, and the whole-day RC parameter are calculated from data taken over a 24-hour period of time, and wherein the night-time R parameter, the night-time C parameter, the night-time Q parameter, and the night-time RC parameter are calculated from data taken during an absence of solar exposure.

(8) The method of improving an energy parameter estimation of any one of (1) through (7), further includes calculating a daytime R parameter as a product of the R adjustment coefficient and a night-time optimum R parameter; calculating a daytime C parameter as a product of the C adjustment coefficient and a night-time optimum C parameter, calculating a daytime Q parameter as a product of the Q adjustment coefficient and a night-time optimum Q parameter at said each of the respective outdoor temperatures; calculating a daytime RC parameter as a product of the RC adjustment coefficient and a night-time optimum RC parameter at said each of the respective outdoor temperatures; and improving the energy parameter estimation to reduce errors corresponding to variations in solar exposure by adjusting night time parameters to be used as daytime parameters via the daytime R parameter, the daytime C parameter, the daytime Q parameter, and the daytime RC parameter.

(9) The method of improving an energy parameter estimation of any one of (1) through (8), wherein the plurality of power systems includes a plurality of thermostatically controlled appliances (TCAs).

(10) The method of improving an energy parameter estimation of any one of (1) through (9), wherein the plurality of TCAs includes a plurality of heating, ventilation, and air conditioning (HVAC) systems, and the power consumption database includes an HVAC consumption database.

(11) A decoupled equivalent thermal parameter (ETP) model processor includes circuitry. The circuitry is configured to store power consumption data retrieved from a plurality of power systems into a power consumption database; convert the power consumption data into power activated time cycles and power non-activated time cycles; calculate median time values of the power activated time cycles and the power non-activated time cycles for respective outdoor temperatures; derive parameters for a thermal resistance (R) parameter and a capacitance (C) parameter for a predetermined heat flow (Q) parameter at each of the respective outdoor temperatures for the plurality of power systems; compare the converted power activated time cycles to the actual power activated time cycles for the plurality of power systems; compare the converted power non-activated time cycles to the actual power non-activated time cycles for the plurality of power systems; calculate a first improved resistance-capacitance-heat flow (RCQ) parameter set and a respective first outdoor temperature for the compared and converted power activated time cycles to the actual power activated time cycles; calculate a second improved RCQ parameter set and a respective second outdoor temperature for the compared and converted power non-activated time cycles to the actual power non-activated time cycles; calculate the Q parameter at each of the respective outdoor temperatures during the power activated time cycles for the plurality of power systems; and calculate the R parameter and the C parameter at each of the respective outdoor temperatures during the power non-activated time cycles for the plurality of power systems.

(12) The decoupled ETP model processor of (11), wherein the circuitry is further configured to calculate an estimated duration of each of the power activated time cycles from the Q parameter calculated at each of the respective outdoor temperatures; and calculate an estimated duration of each of the power non-activated time cycles from the R parameter and the C parameter calculated at each of the respective outdoor temperatures; wherein the calculated Q parameter, the calculated R parameter, and the calculated C parameter improve energy parameter estimation to reduce errors corresponding to variations in said each of the respective outdoor temperatures by decoupling daytime parameters from night time parameters via the estimated duration of said each of the power activated time cycles from the Q parameter and via the estimated duration of said each of the power non-activated time cycles from the R parameter and the C parameter.

(13) The decoupled ETP model processor of either (11) or (12), wherein the improved RCQ parameter set is determined by minimizing an error between the converted power activated time cycles and the actual power activated time cycles, and between the converted power non-activated time cycles and the actual power non-activated time cycles.

(14) The decoupled ETP model processor of any one of (11) through (13), wherein the plurality of power systems includes a plurality of thermostatically controlled appliances (TCAs).

(15) An adjusted decoupled ETP model processor includes circuitry. The circuitry is configured to store power consumption data retrieved from a plurality of power systems into a power consumption database; convert the power consumption data into power activated time cycles and power non-activated time cycles; calculate median time values of the power activated time cycles and the power non-activated time cycles for respective outdoor temperatures; derive parameters for a thermal resistance (R) parameter and a capacitance (C) parameter for a predetermined heat flow (Q) parameter at each of the respective outdoor temperatures for the plurality of power systems; compare the converted power activated time cycles to the actual power activated time cycles for the plurality of power systems; compare the converted power non-activated time cycles to the actual power non-activated time cycles for the plurality of power systems; calculate a first improved resistance-capacitance-heat flow (RCQ) parameter set and a respective first outdoor temperature for the compared and converted power activated time cycles to the actual power activated time cycles; calculate a second improved RCQ parameter set and a respective second outdoor temperature for the compared and converted power non-activated time cycles to the actual power non-activated time cycles; calculate an R adjustment coefficient as a ratio of a whole-day R parameter to a night-time R parameter; calculate a C adjustment coefficient as a ratio of a whole-day C parameter to a night-time C parameter, calculate a Q adjustment coefficient at the respective outdoor temperature as a ratio of a whole-day Q parameter at the respective outdoor temperature to a night-time Q parameter at the respective outdoor temperature; and calculate an RC adjustment coefficient at the respective outdoor temperature as a ratio of a whole-day RC parameter at the respective outdoor temperature to a night-time RC parameter at the respective outdoor temperature.

(16) The adjusted decoupled ETP model processor of (15), wherein the circuitry is further configured to calculate a daytime R parameter as a product of the R adjustment coefficient and a night-time optimum R parameter; calculate a daytime C parameter as a product of the C adjustment coefficient and a night-time optimum C parameter; calculate a daytime Q parameter as a product of the Q adjustment coefficient and a night-time optimum Q parameter at the respective outdoor temperature; and calculate a daytime RC parameter as a product of the RC adjustment coefficient and a night-time optimum RC parameter at said each of the respective outdoor temperatures; wherein the calculated daytime R parameter, the calculated daytime C parameter, the calculated daytime Q parameter, and the calculated daytime RC parameter improve energy parameter estimation to reduce errors corresponding to variations in solar exposure by adjusting night time parameters to be used as daytime parameters.

(17) The adjusted decoupled ETP model processor of either (15) or (16), wherein the whole-day R parameter, the whole-day C parameter, the whole-day Q parameter, and the whole-day RC parameter are calculated from data taken over a 24-hour period of time, and wherein the night-time R parameter, the night-time C parameter, the night-time Q parameter, and the night-time RC parameter are calculated from data taken during an absence of solar exposure.

(18) The adjusted decoupled ETP model processor of any one of (15) through (17), wherein the improved RCQ parameter set is determined by minimizing an error between the converted power activated time cycles and the actual power activated time cycles, and between the converted power non-activated time cycles and the actual power non-activated time cycles.

(19) The adjusted decoupled ETP model processor of any one of (15) through (18), wherein the plurality of power systems includes a plurality of thermostatically controlled appliances (TCAs).

(20) The adjusted decoupled ETP-model processor of any one of (15) through (19), wherein the plurality of TCAs includes a plurality of heating, ventilation, and air conditioning (HVAC) systems, and the power consumption database includes an HVAC consumption database.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 12A:
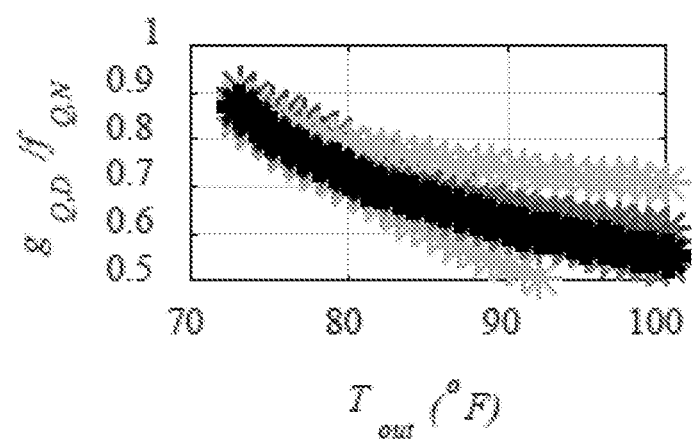
FIG. 12A is a graph illustrating an example of $$\frac{g_{Q,D}^i(T_{out})}{f_{Q,N}^i(T_{out})}$$
Figure 12B:
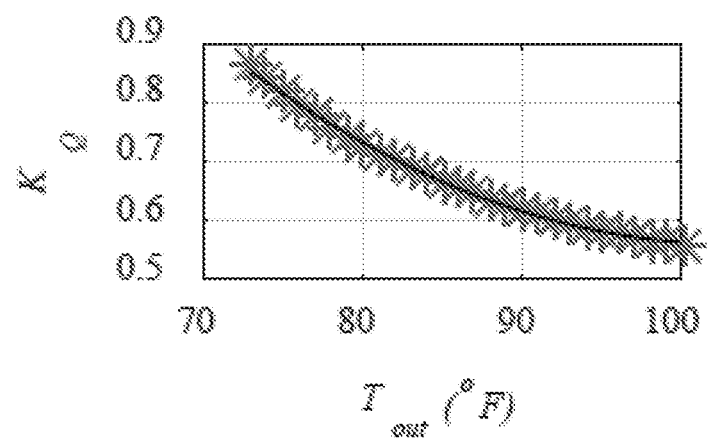
Figure 13A:
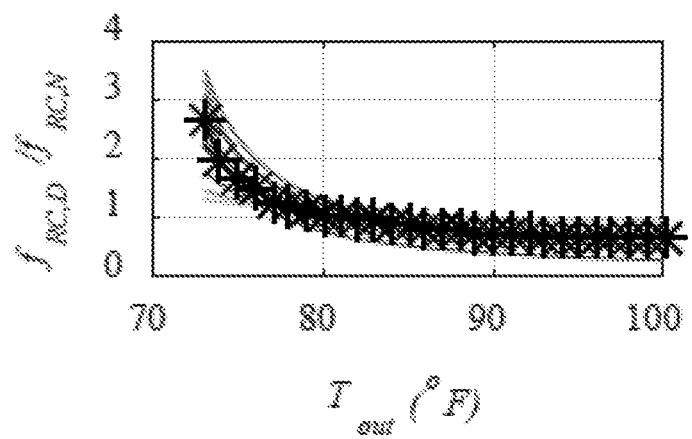

((whole day heat flow model parameter at $T_{out}$)/(night heat flow model parameter at $T_{out}$)) when i ranges from 1 to 10 and $K_Q$ (heat flow adjustment coefficient) with respect to $T_{out}$ according to one embodiment;

FIG. 12B is a graph illustrating the linear fit model $\tilde{K}_Q$ with respect to $T_{out}$ according to one embodiment;

FIG. 13A is a graph illustrating an example of $$\frac{f_{RC,D}^i(T_{out})}{f_{RC,N}^i(T_{out})}$$

Figure 13B:
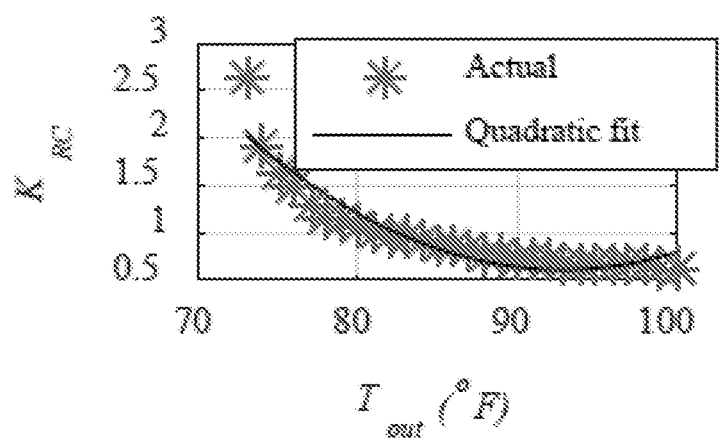
Figure 14:
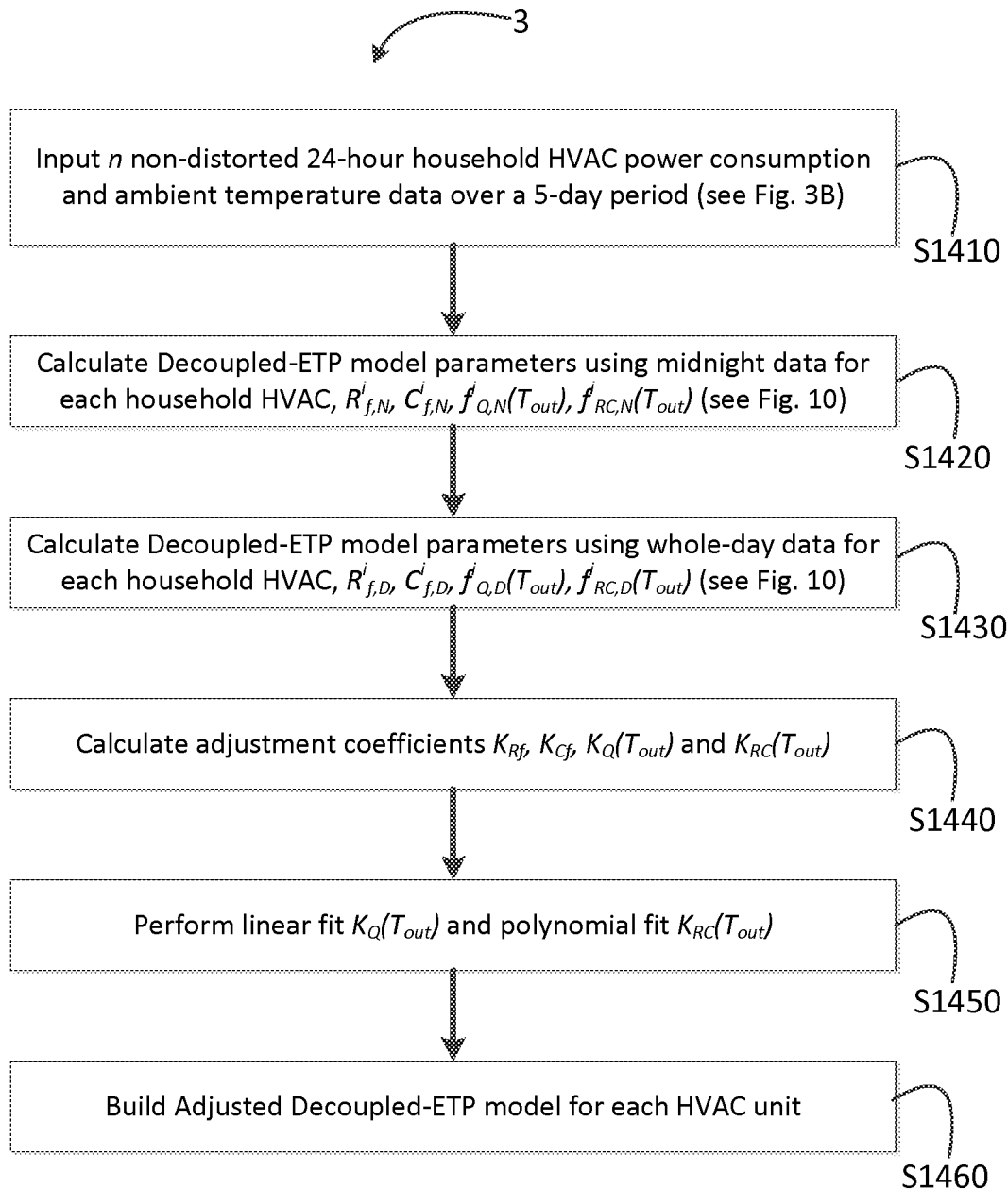
Figure 15A:
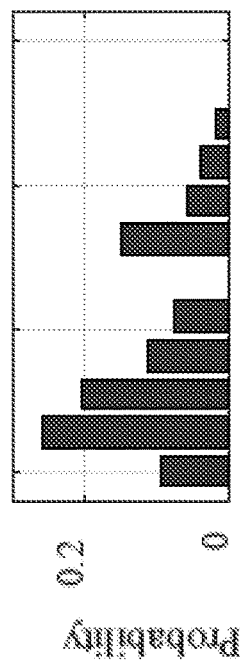
Figure 15B:
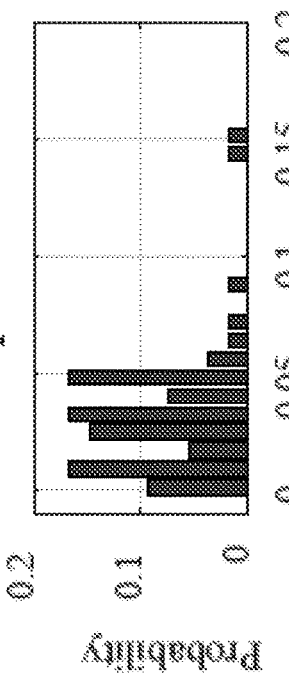
Figure 15C:
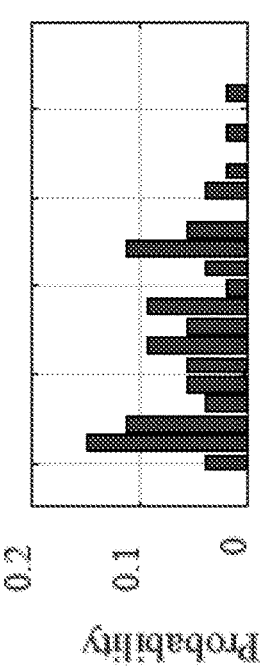
Figure 15D:
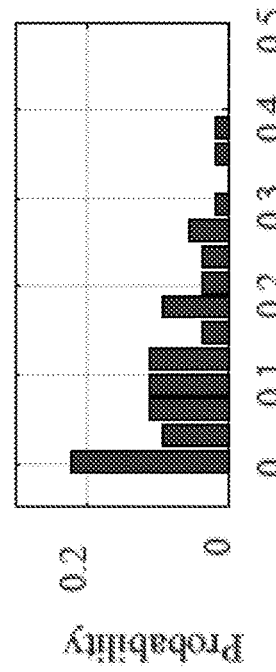
Figure 16A:
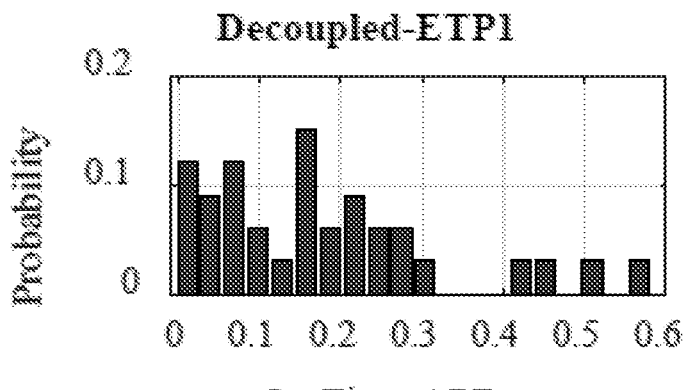
Figure 16B:
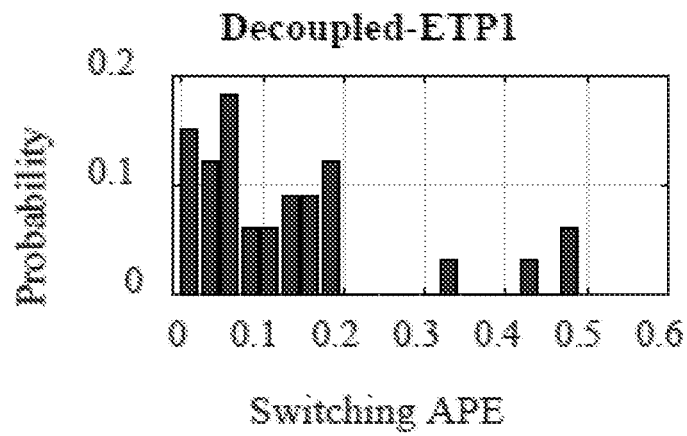
Figure 16C:
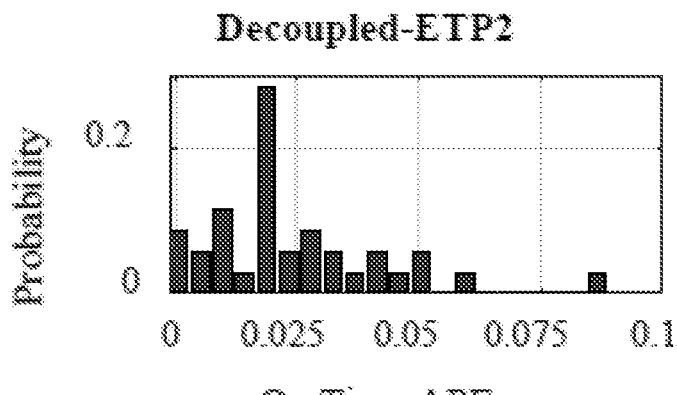
Figure 16D:
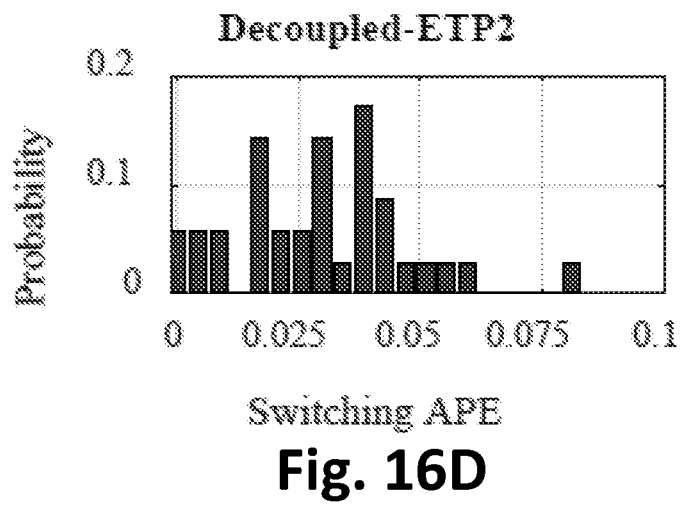
Figure 16E:
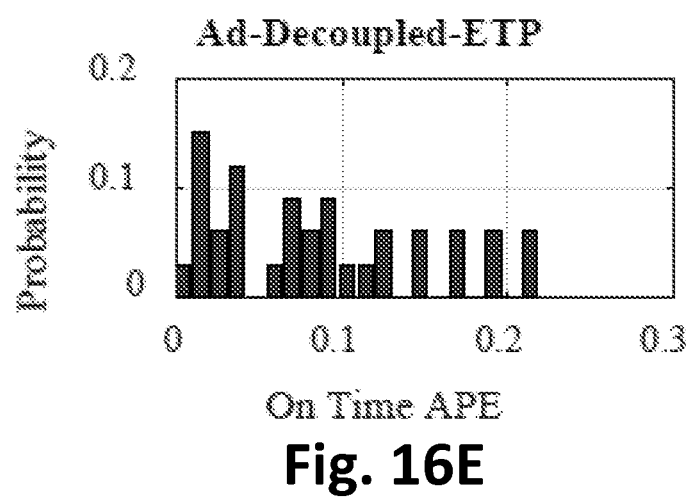
Figure 16F:
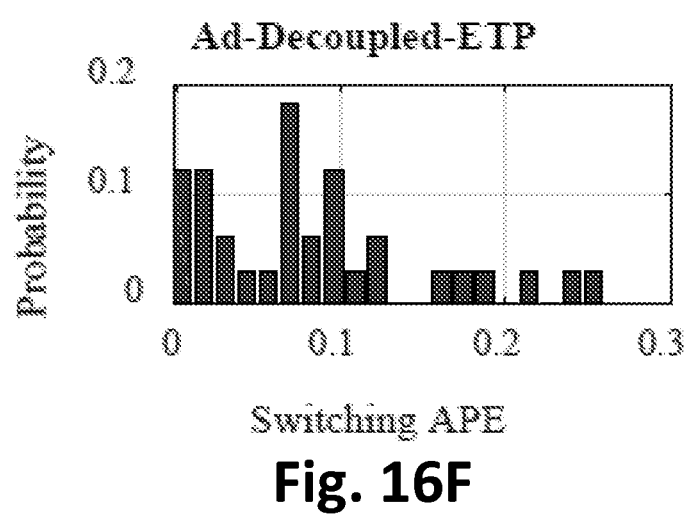
Figure 17:
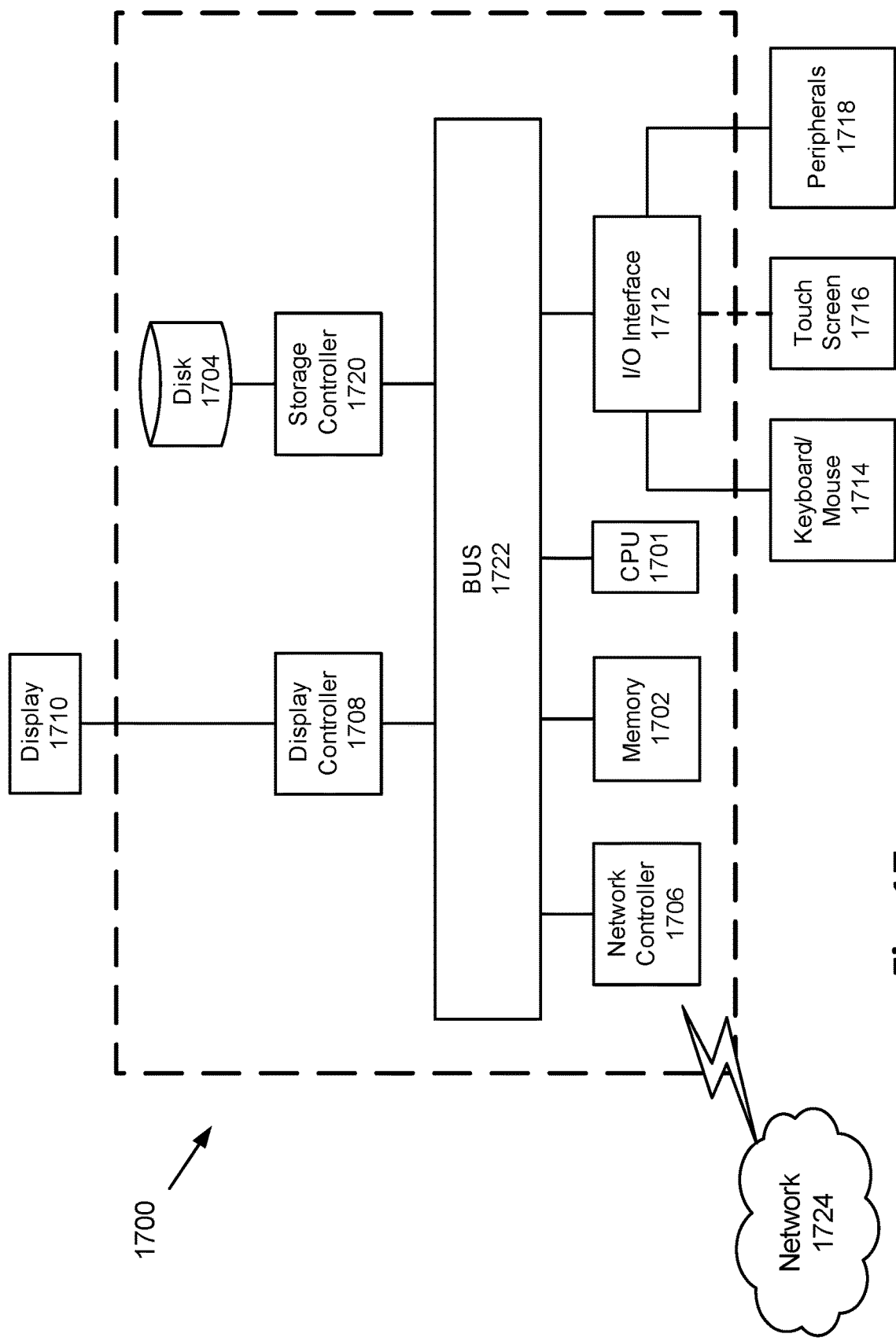
Figure 1A:
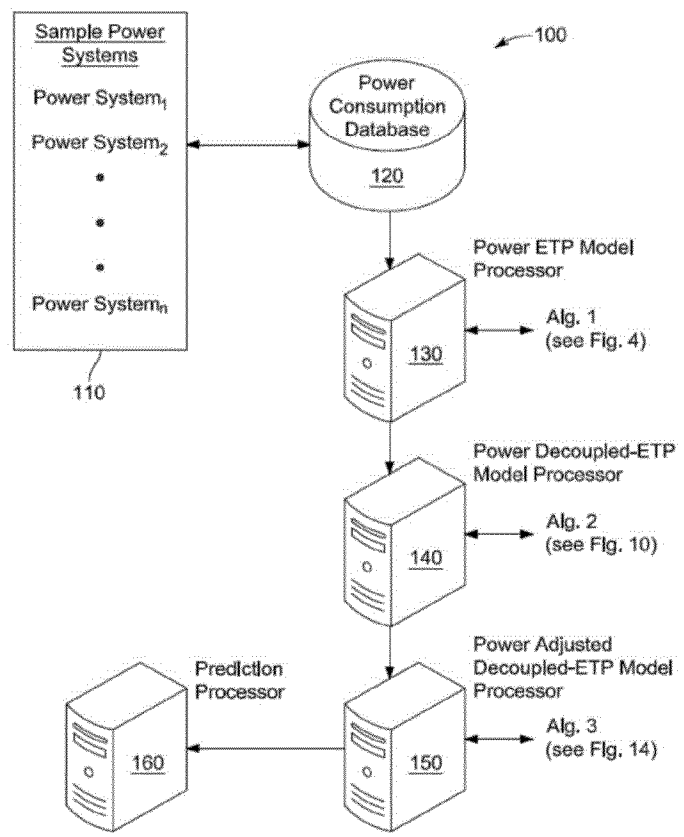
Figure 1B:
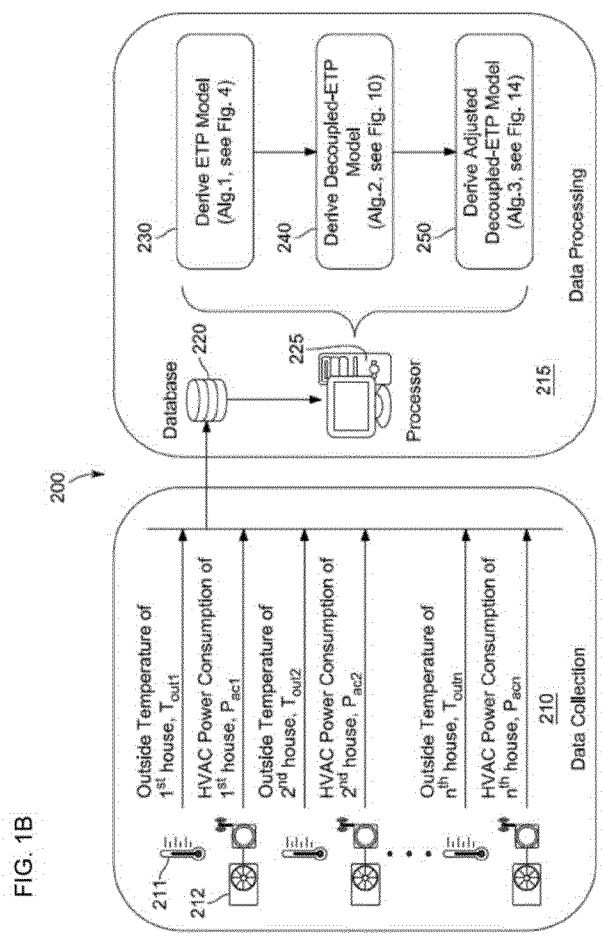
Figure 2:
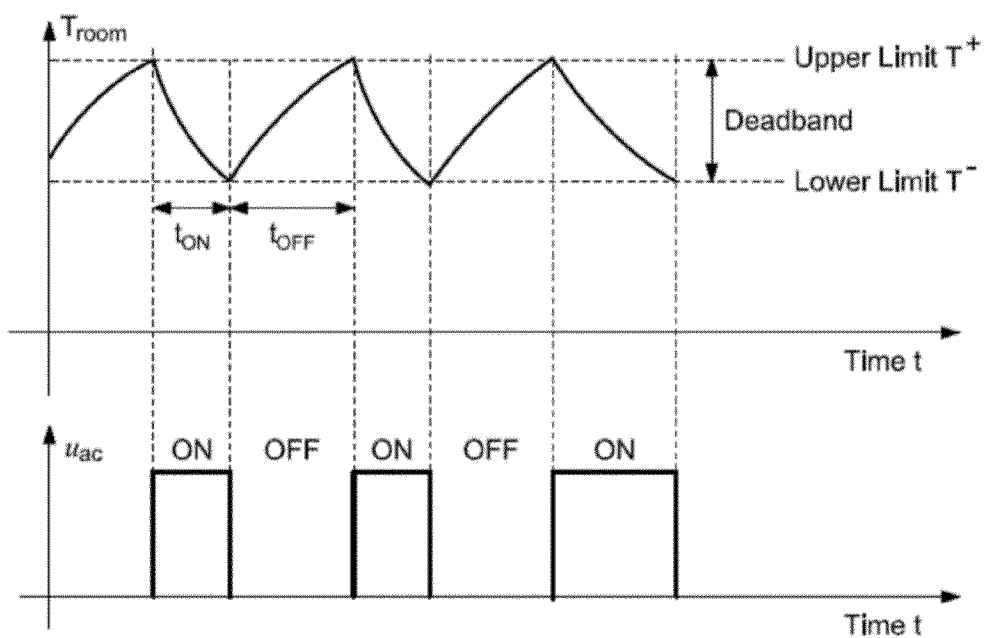
Figure 3A:
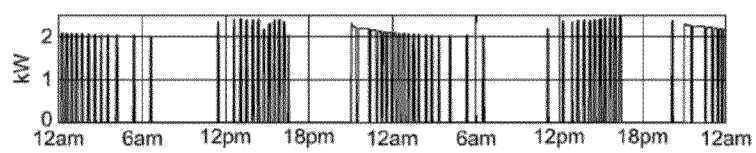
Figure 3B:
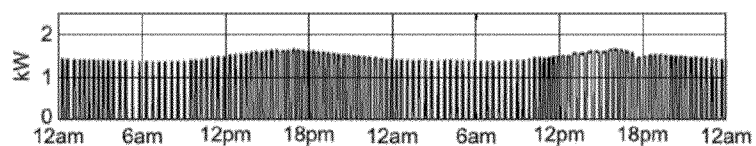
Figure 3C:
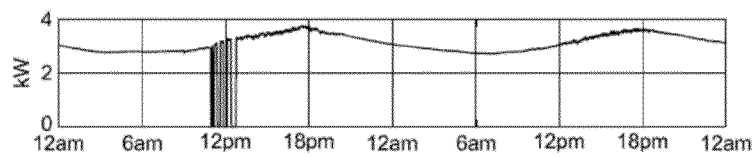
Figure 4:
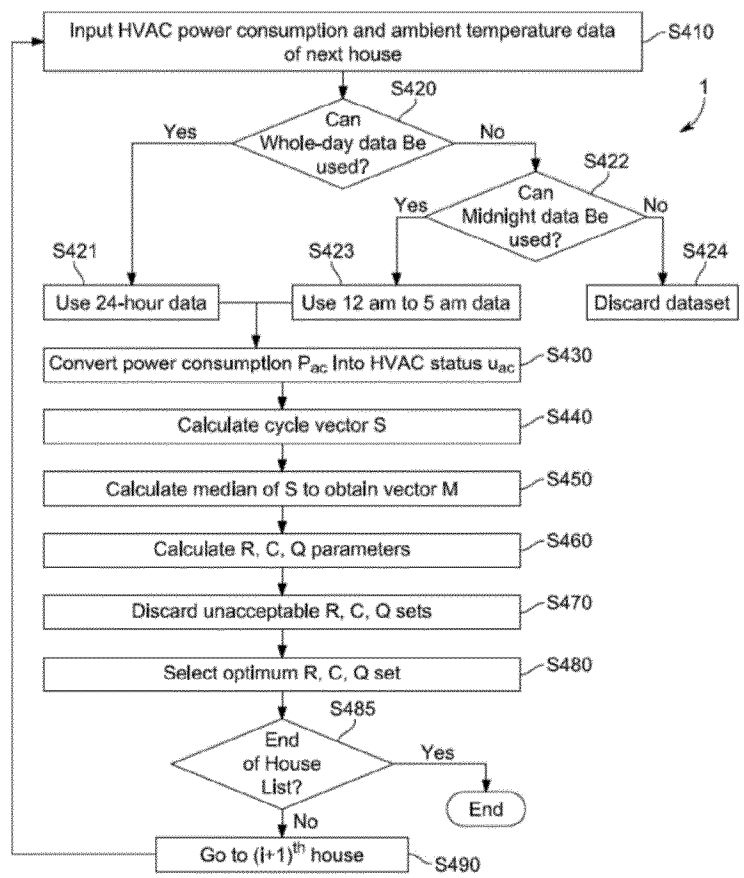
Figure 5:
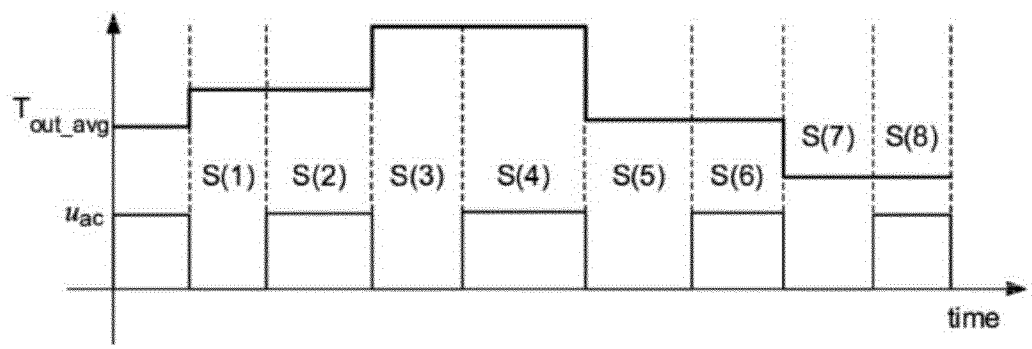
Figure 6A:
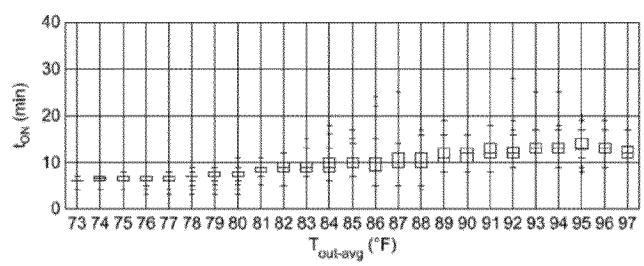
Figure 6B:
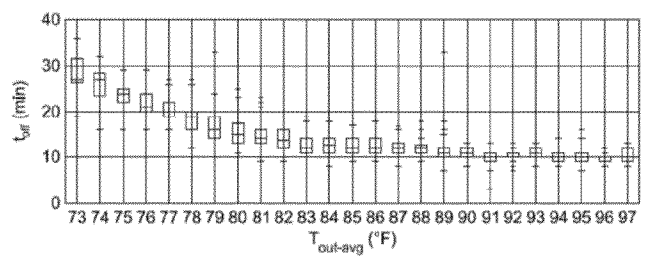
Figure 6C:
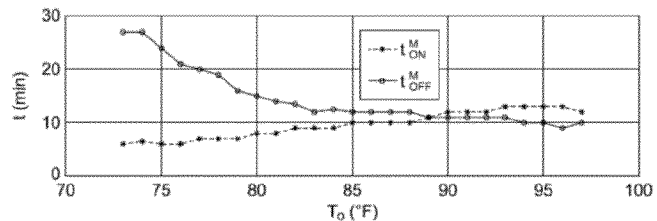
Figure 7A:
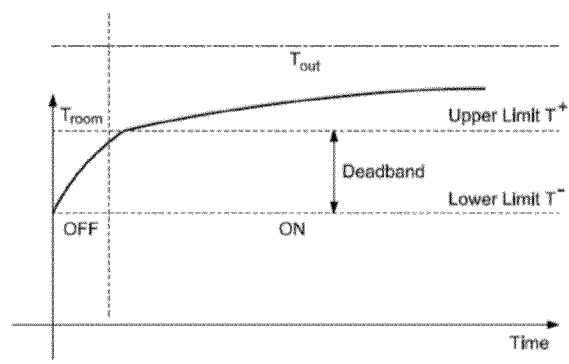
Figure 7B:
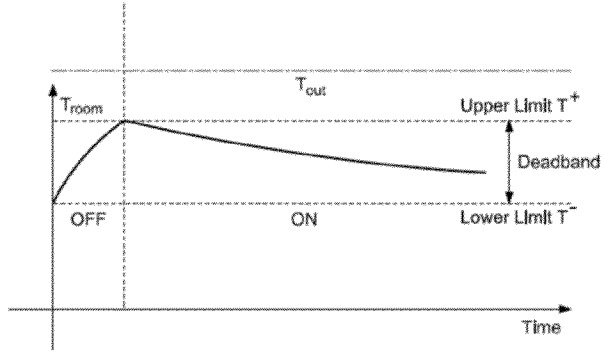
Figure 8:
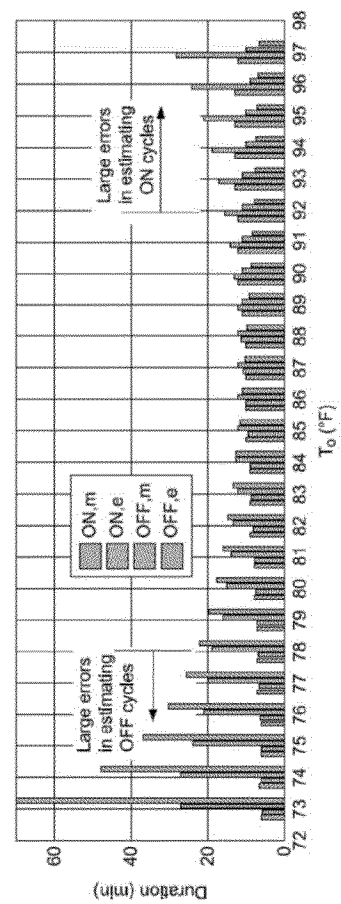
Figure 9A:
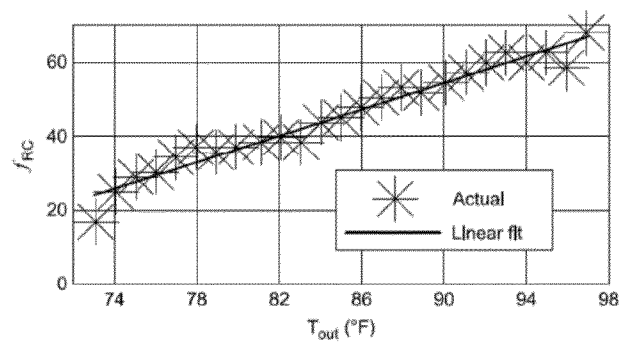
Figure 9B:
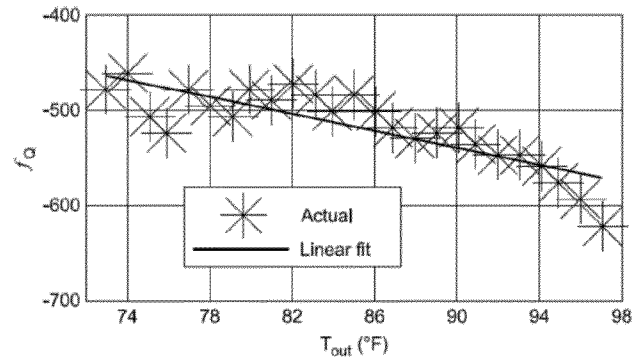
Figure 10:
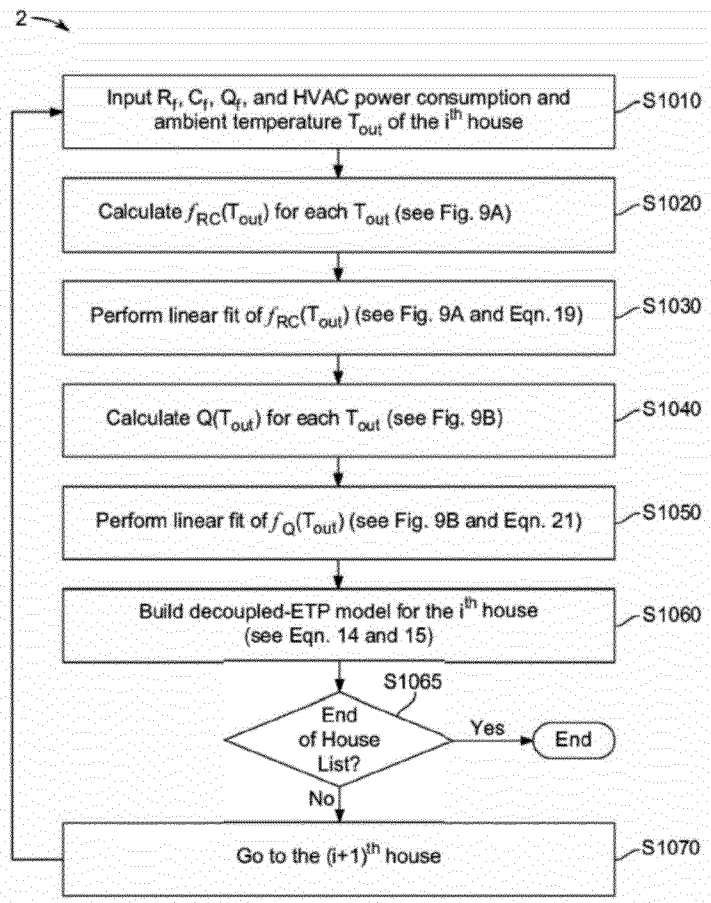
Figure 11:
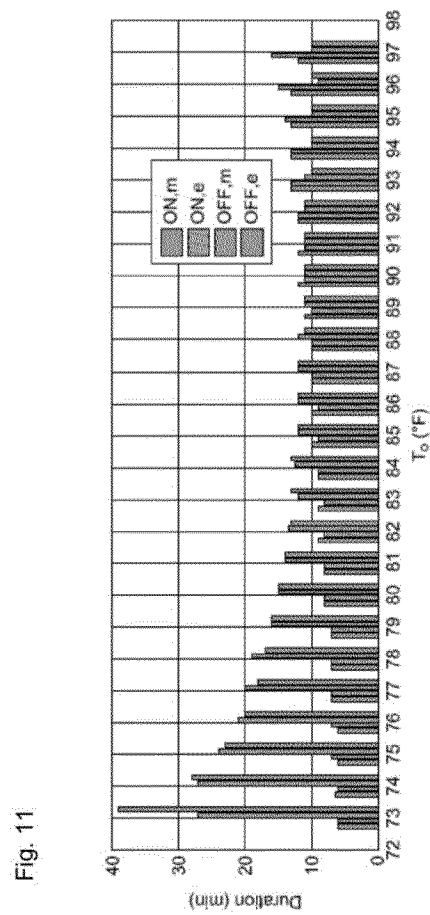
Figure 12A:
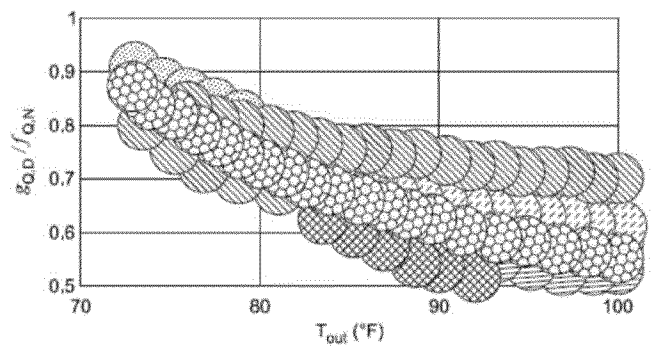
Figure 12B:
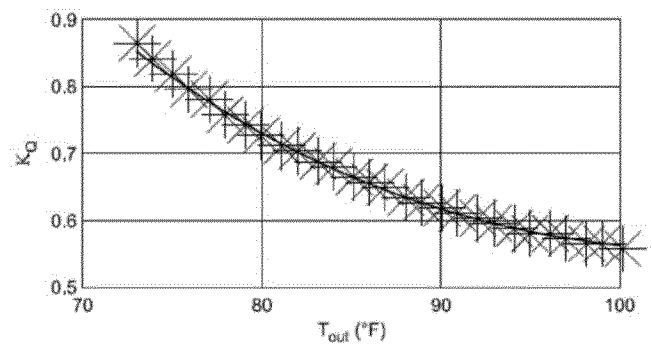
Figure 13A:
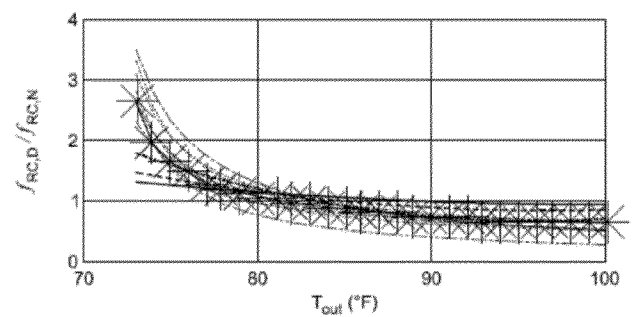
Figure 13B:
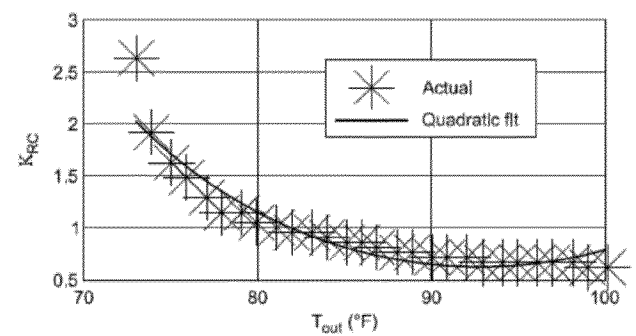
Figure 14:
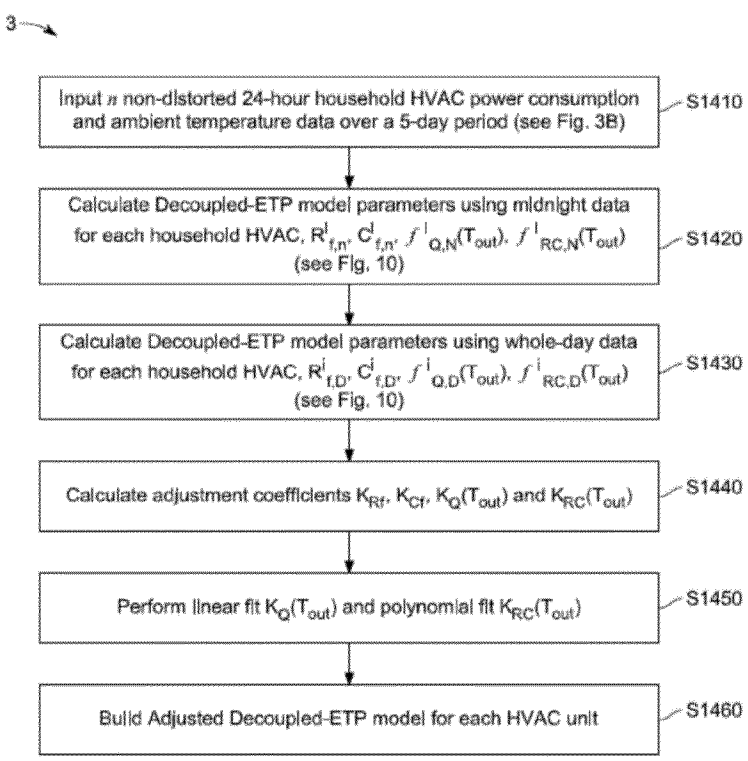
Figure 16A:
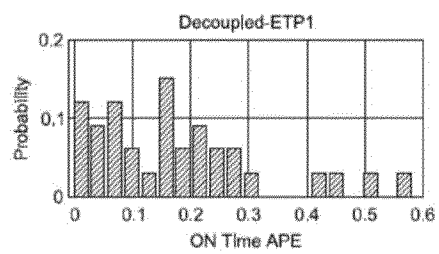
Figure 16B:
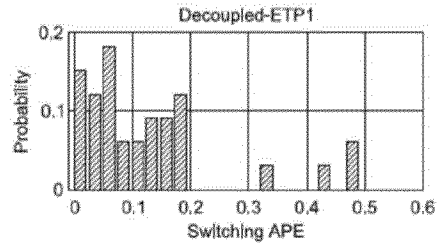
Figure 16C:
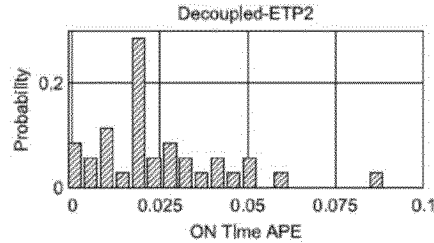
Figure 16D:
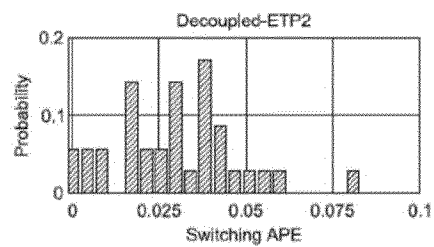
Figure 16E:
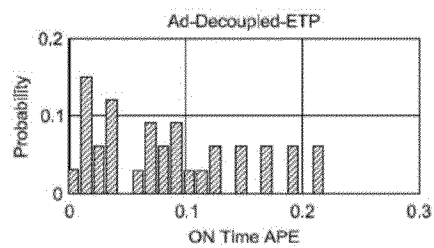
Figure 16F:
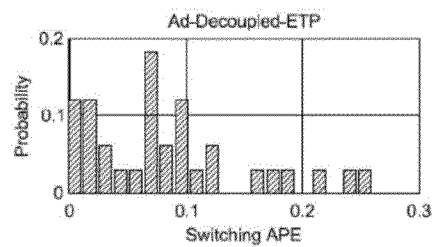
Figure 17:
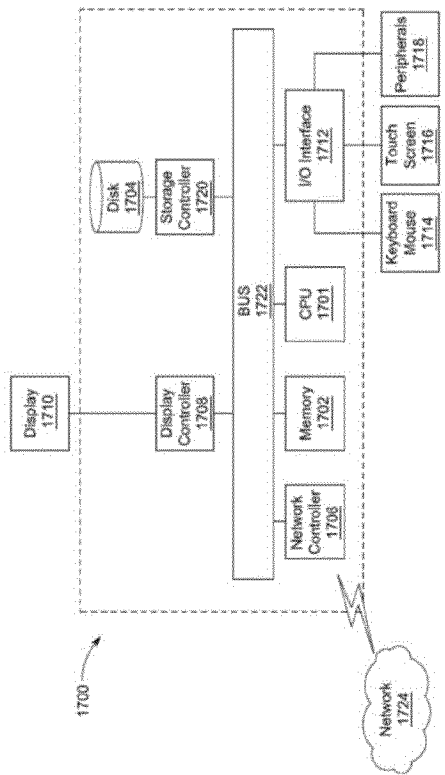

((whole day resistance and capacitance model parameters at $T_{out}$)/(night resistance and capacitance model parameters at $T_{out}$)) when i ranges from 1 to 10 and $K_Q$ with respect to $T_{out}$ according to one embodiment;

FIG. 13B is a graph illustrating a second order polynomial model $\tilde{K}_Q$ versus $T_{out}$ according to one embodiment;

FIG. 14 is a flow chart of Algorithm 3 for an Adjusted Decoupled-ETP model according to one embodiment;

FIGS. 15A and 15B are bar graphs illustrating a mean absolute percentage error (APE) and a standard deviation (SD) of the total ON time based on night time data according to one embodiment;

FIGS. 15C and 15D are bar graphs illustrating an APE and a SD of the total number of switchings according to one embodiment;

FIGS. 16A and 16B are bar graphs illustrating ON time APE and Switching APE, respectively for a Decoupled-ETP1 model according to one embodiment;

FIGS. 16C and 16D are bar graphs illustrating ON time APE and Switching APE, respectively for a Decoupled-ETP2 model according to one embodiment;

FIGS. 16E and 16F are bar graphs illustrating ON time APE and Switching APE, respectively for an Adjusted Decoupled-ETP model according to one embodiment; and FIG. 17 is a block diagram illustrating a hardware description of a computer according to one embodiment.

DETAILED DESCRIPTION

The following descriptions are meant to further clarify the present disclosure by giving specific examples and embodiments of the disclosure. These embodiments are meant to be illustrative rather than exhaustive. The full scope of the disclosure is not limited to any particular embodiment disclosed in this specification, but rather is defined by the claims.

It will be appreciated that in the development of any such actual implementation, numerous implementation-specific decisions need to be made in order to achieve the developer's specific goals, such as compliance with application- and business-related constraints, and that these specific goals will vary from one implementation to another and from one developer to another.

A data-driven, decoupled modeling method for deriving model parameters of thermostatically controlled appliances (TCAs) is described herein using a heating, ventilation, and air conditioning (HVAC) unit as an example. The method uses outdoor temperature and HVAC power consumption as inputs to estimate the parameters of the HVAC equivalent thermal parameter (ETP) model.

An HVAC is used as an example to illustrate model parameter estimation processes and adjustment algorithms. Residential households are used as a primary focus herein. Therefore, models of HVAC units with variable frequency drives are not considered. However, adjustments can be made to incorporate the embodiments described herein to HVAC units with variable frequency drives. In addition, the methods and systems described herein can easily be extended to a parameter estimation of many other thermostatically controlled appliances (TCAs), such as water heaters and refrigerators.

Figure 1A:
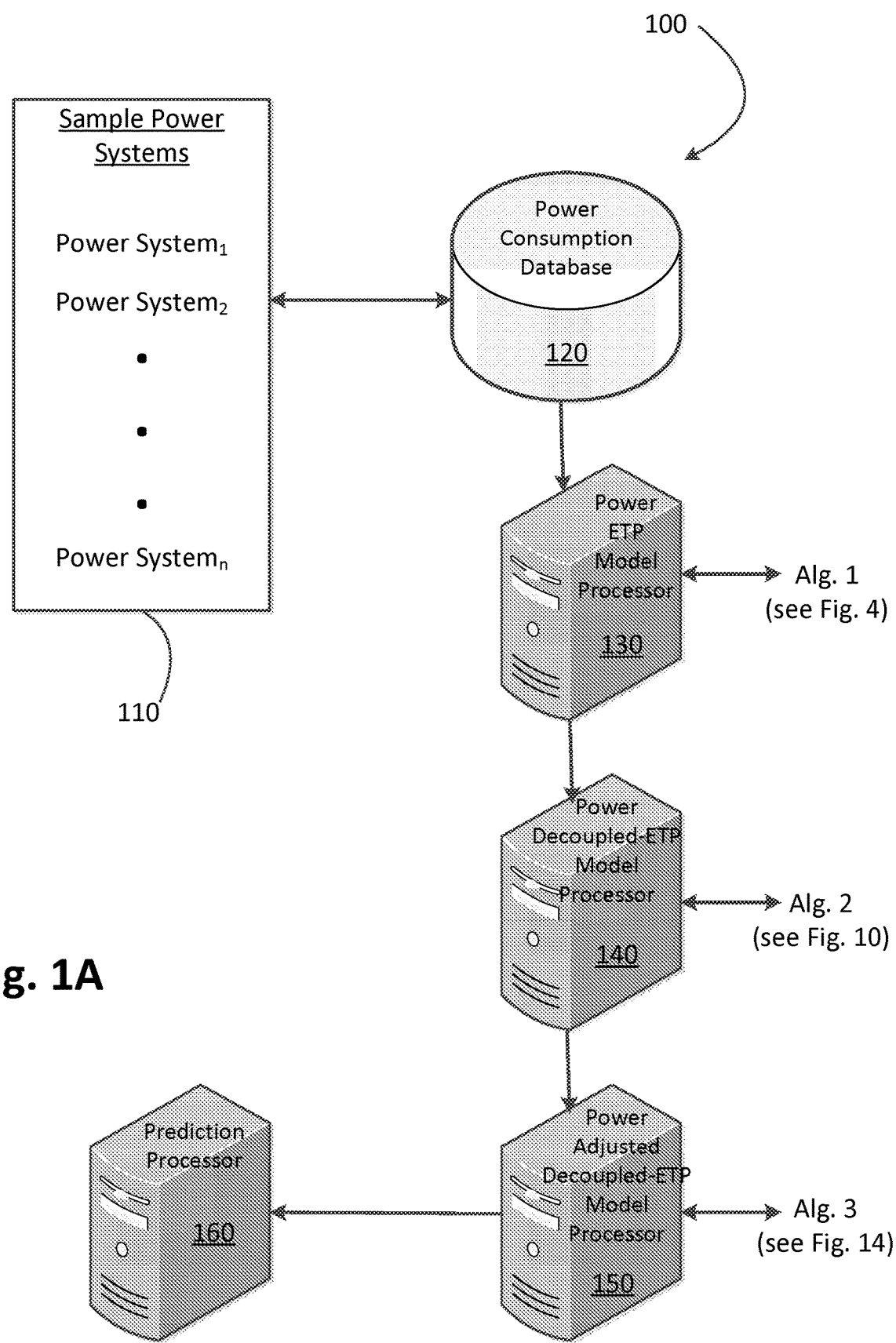
FIG. 1A is a diagram illustrating an exemplary modeling system according to one embodiment.

FIG. 1A is a diagram illustrating an exemplary modeling system 100 used in accordance with embodiments described herein. The methods are tested and validated on a number of power systems 110, such as TCAs or HVAC systems of associated residential houses. For example, an HVAC system includes the power system 110 that provides heat and/or air conditioning to the house, and also includes an associated meter for controlling the power system 110. A power system can also include other TCAs, such as water heaters and refrigerators. Consumption data, such as actual one-minute HVAC consumption data is stored in a power consumption database 120.

A power ETP model processor 130 uses power consumption data from the power consumption database 120, such as HVAC power consumption data and outdoor temperature data as inputs to estimate the parameters of the power ETP model. A description of Algorithm 1 to estimate the parameters of the power ETP model is given in detail with reference to FIG. 4.

A power Decoupled-ETP model processor 140 is configured with circuitry to decouple the modeling of "ON" and "OFF" periods of a power unit to improve the modeling accuracy. In an example, power Decoupled-ETP model processor 140 is an HVAC Decoupled-ETP model processor. A description of Algorithm 2 to decouple the modeling of "ON" and "OFF" periods is given in detail with reference to FIG. 10.

A power Adjusted Decoupled-ETP model processor 150 is configured with circuitry to derive the model parameters using only midnight data. In an example, power Adjusted Decoupled-ETP model processor 150 is an HVAC Adjusted Decoupled-ETP model processor. The method is applicable for cases in which the daytime power consumptions are heavily distorted by occupant activities. A description of Algorithm 3 to decouple and adjust the model parameters is given in detail with reference to FIG. 14.

A prediction processor 160 is configured with circuitry to process and output a model used to forecast power unit behavior for energy management applications based upon one or more of the power ETP model processor 130, the power Decoupled-ETP model processor 140, and the power Adjusted Decoupled-ETP model processor 150. For example, the model output uses outdoor temperature and HVAC power consumption data without knowledge of detailed parameters of the specific houses in which the HVAC units reside.

FIG. 1A illustrates modeling system 100 as separate units. However, the processors described herein can be combined into one or more individual processing units, or other processing units not illustrated in FIG. 1 may be present. The processing units described in FIG. 1 encompass processing circuitry, either separately or as a combined whole that is configured to execute the process steps described herein.

Figure 1B:
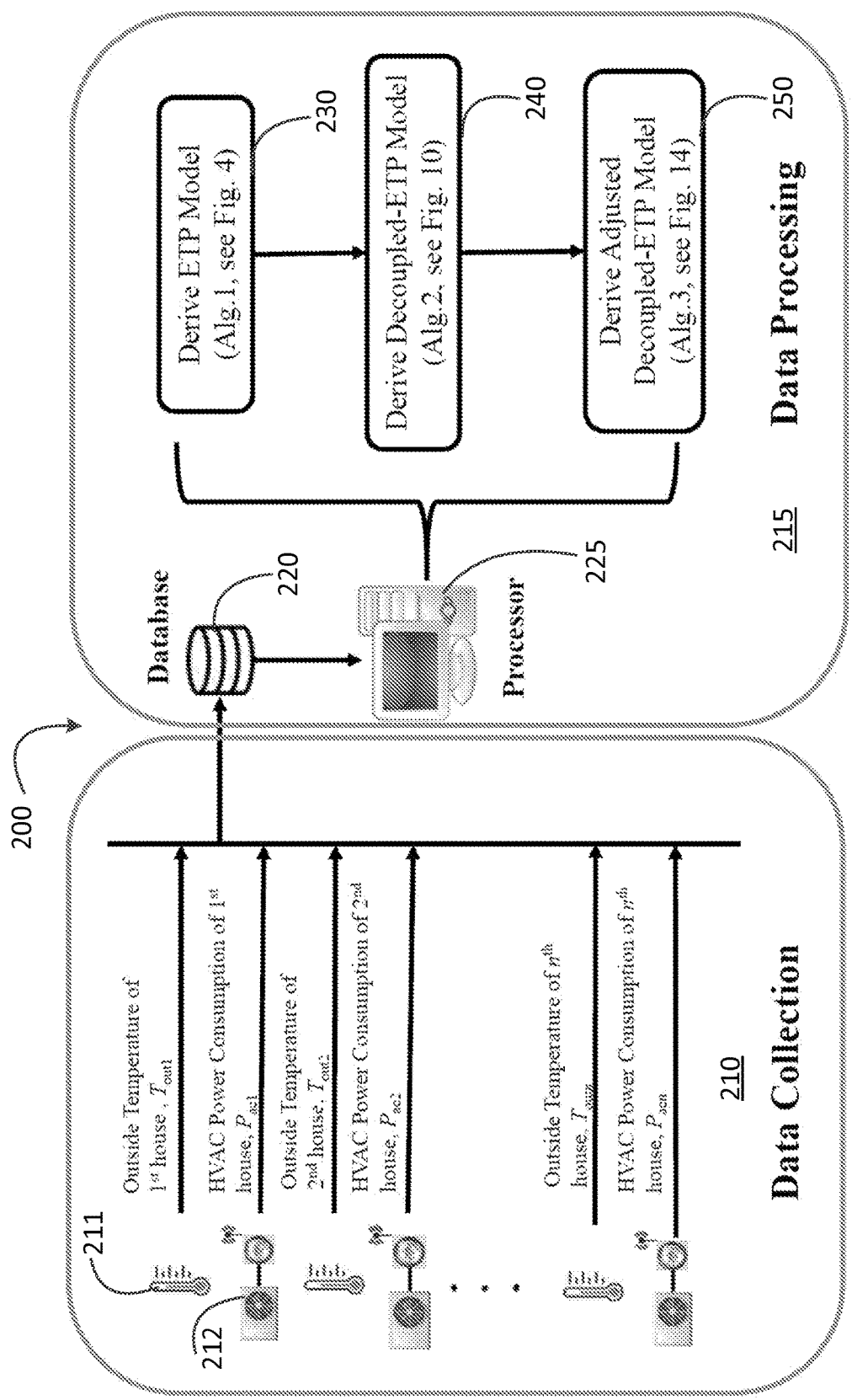
FIG. 1B illustrates a second exemplary modeling system for an HVAC system according to one embodiment.

FIG. 1B illustrates a second exemplary modeling system 200 for an HVAC system. A data collection module 210 illustrates devices in which data is collected, such as a thermometer 211 for each house and a thermostat 212 for each house.

A data processing module 215 stores the data collected from the data collection module 210 in a data processing database 220. The retrieved data is processed via processor 225. Processor 225 could be a single processor or multiple processors running in parallel. Processor 225 derives the ETP model 230 as illustrated in Algorithm 1 in FIG. 4. Processor 225 also derives the Decoupled-ETP model 240 as illustrated in Algorithm 2 in FIG. 10. Processor 225 also derives the Adjusted Decoupled-ETP model 250 as illustrated in Algorithm 3 in FIG. 14.

Figure 2:
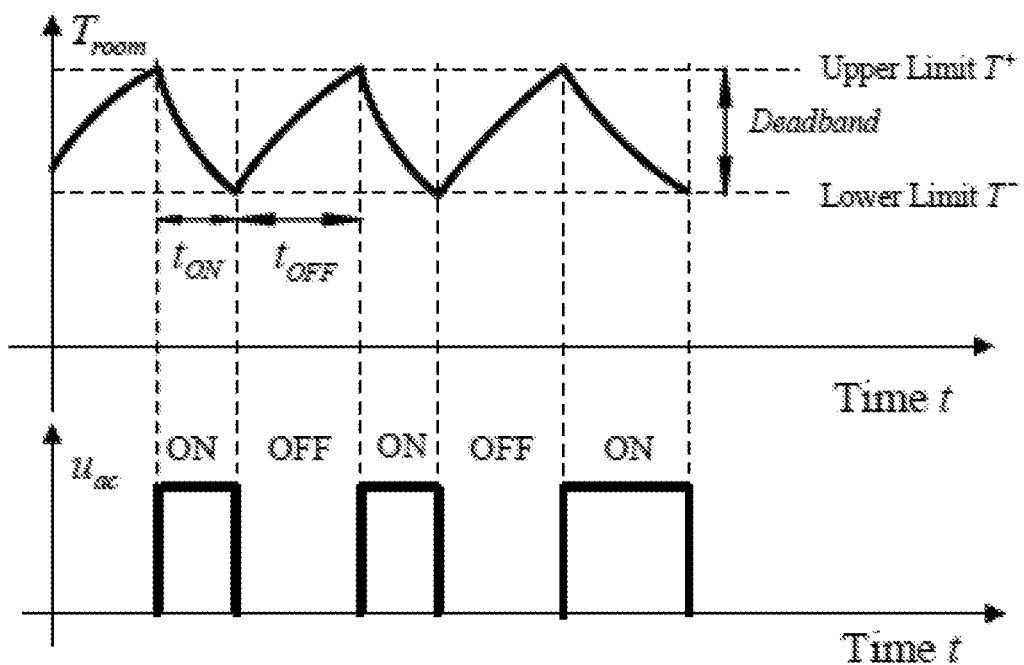
FIG. 2 is a graph illustrating an output based on a first order HVAC ETP model according to one embodiment.

FIG. 2 is a graph illustrating a first order HVAC ETP model. For a current time step of t=k, the indoor room temperature $T_{room}$ at t=k+1 can be represented by the first order ETP model as $$T_{room}(k+1) = \begin{cases} T_{out}(k+1) + Q \times R - e^{-\Delta t/(R \times C)} \times \\ \quad (T_{out}(k) + Q \times R - T_{room}(k)) & \text{when } u_{ac}(k) = 1 \\ & \text{i.e. } HVAC \text{ is on} \\ T_{out}(k) - (T_{out}(k) - T_{room}(k)) \times e^{-\Delta t/(R \times C)} & \text{when } u_{ac}(k) = 0 \\ & \text{i.e. } HVAC \text{ is off} \end{cases} \quad (1)$$

where $T_{out}$ and $T_{room}$ are the outdoor and room temperature, respectively, $u_{ac}$ is the HVAC ON/OFF status, $\Delta t$ is the duration of each time step, R represents thermal resistance, C represents thermal capacitance, and Q represents the heat flow provided by the HVAC unit. Therefore, the HVAC status $u_{ac}$ at the next time step k+1 can be determined by $$u_{ac}(k+1) = \begin{cases} 1 & T_{room}(k+1) < T^- \\ 0 & T_{room}(k+1) > T^+ \\ u_{ac}(k) & T^+ > T_{room}(k+1) > T^- \end{cases} \quad (2)$$

where $T^-$ and $T^+$ refer to the lower and upper bounds of the HVAC temperature deadband, respectively. A predefined upper limit temperature and a predefined lower limit temperature can be established according to specific process objectives, equipment limitations, etc. For example, the predefined upper limit temperature can be the upper temperature of an indoor comfort zone such as 72° F., while the predefined lower limit temperature can be the lower temperature of the indoor comfort zone such as 68° F.

If $T_{out}$ remains constant, (1) can be rewritten as $$T^- = T_{out} + Q \times R - (T_{out} + Q \times R - T^+) \times e^{-t_{ON}/(R \times C)} \quad (3)$$

$$T^+ = T_{out} - (T_{out} - T^-) \times e^{-t_{OFF}/(R \times C)} \quad (4)$$

where $t_{ON}$ and $t_{OFF}$ refer to a complete ON and OFF cycle, as illustrated in FIG. 2.

A primary advantage of the first order ETP model for data-driven modeling is its simplicity. RCQ values can easily be derived from the set of five variables: $T^+$, $T^-$, $T_{out}$, $t_{ON}$ and $t_{OFF}$. One disadvantage of the ETP model is that $t_{ON}$ and $t_{OFF}$ will change when $T_{out}$ changes. As a result, one set of RCQ values are needed to meet modeling accuracy requirements for each $T_{out}$ range. In addition, day-time and night-time RCQ values may not be the same, even though they are derived at the same $T_{out}$ because of solar radiation. For example, one set of RCQ values can only be used for a $T_{out}$ range of 5-10° F. for the nighttime portion of the day. A Decoupled-ETP model with a tuning method is described herein to resolve these modeling issues.

The HVAC consumption, $P_{ac}$, can be converted to an on/off status $u_{ac}(t)$ based on $$u_{ac}(t) = \begin{cases} 1 & \text{if } P_{ac}(t) > 0.5 \times P_{ac,max} \\ 0 & \text{if } P_{ac}(t) \leq 0.5 \times P_{ac,max} \end{cases} \quad (5)$$

The HVAC consumption, $P_{ac}$, and the outdoor temperature, $T_{out}$, were collected by researchers in the PECAN street project. See Pecan Street Inc., "Dataport,", 2017, incorporated herein by reference in its entirety. One hundred houses were selected with one-minute sub-metered HVAC power consumption and outdoor temperature data. A summer time period time length was used in order to model an HVAC unit in its cooling mode.

Figure 3A:
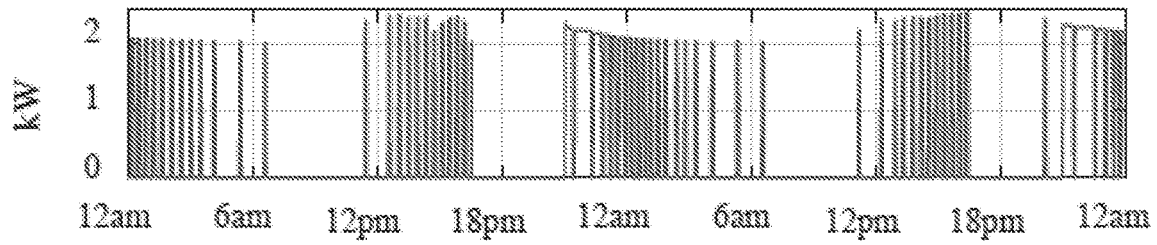
FIG. 3A is a graph illustrating a first type of data for midnight data according to one embodiment.
Figure 3B:
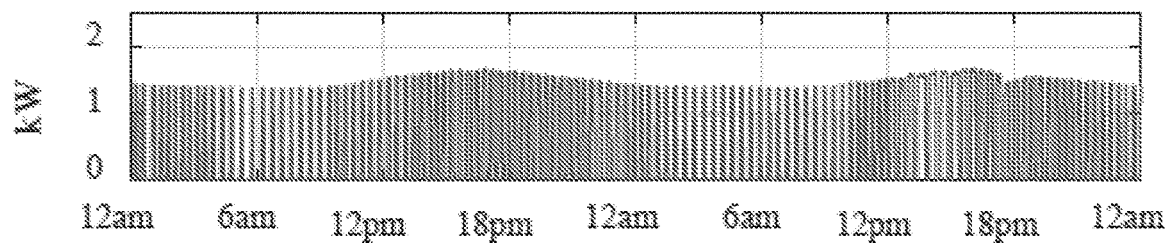
FIG. 3B is a graph illustrating a second type of data for 24-hr whole-day data according to one embodiment.
Figure 3C:
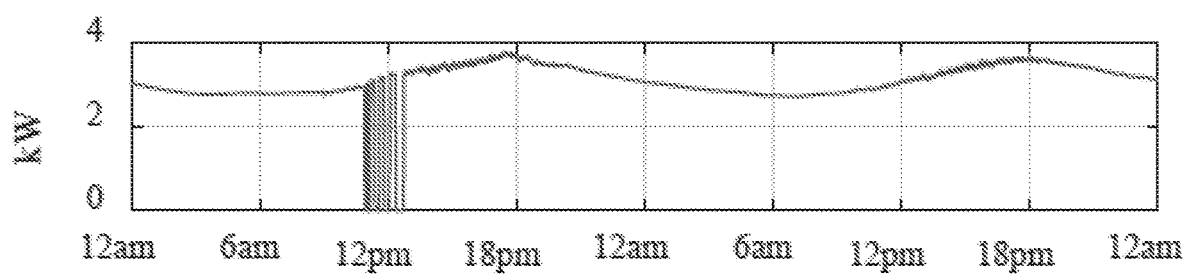
FIG. 3C is a graph illustrating a third type of data, which is discarded data according to one embodiment.

To derive the RCQ parameters, the data was screened to exclude the periods when the HVAC power consumption was significantly distorted by the activities of occupants, such as manually turning the HVAC unit on and off, frequently changing the thermostat set points, opening doors and/or windows for a prolonged time period, etc. Therefore, the energy usage data was separated into three types. FIG. 3A is a graph illustrating a 48-hour HVAC power consumption curve. The first type of data is for midnight data from 12 a.m. to 5 a.m. when the activities of occupants that could influence the HVAC operations were at a minimum. FIG. 3B is a graph illustrating the 48-hour HVAC power consumption curve for the second type of data for 24-hr whole-day data in which occupants caused very little interference on HVAC operations. FIG. 3C is a graph illustrating the third type of data, which was discarded data in which the HVAC unit operation was either erratic or was frequently changing in an ON/OFF mode. When a household had an under-sized HVAC unit or multiple HVAC units, the HVAC operation cannot be modeled appropriately by the RCQ parameter-based ETP model.

The following exemplary algorithm may be used for selecting datasets according to embodiments described herein.

Exemplary Algorithm 0—Selecting Datasets

Step 1. Input datasets for house i.

Step 2. Convert $P_{ac}(t)$ to on/off status $u_{ac}(t)$ based on Equation (5).

Step 3. Create the ON vector $S_{ON}(i)=\{t_{ON}(i), T_{out,\ avg}(i), t_{START}(i)\}$, i=1, 2 ..., $N_{ON}$.
  Calculate the durations of each ON cycle $t_{on}$, the corresponding average $T_{out}$ (rounded to 1° F.) and the start time $t_{start}$.
  If the difference between maximum and minimum $T_{out}$ during an ON cycle is greater than $\Delta t_{ON}$ (e.g. 4° F.), discard $S_{ON}(i)$.
  If $t_{ON} > \Delta t_{ON,max}$ (e.g. 40 min) or $t_{ON} < \Delta t_{ON,min}$ (e.g. 2 min), discard $S_{ON}(t)$.

Step 4. Create the OFF vector $S_{OFF}(i)=\{t_{OFF}(i), T_{out,\ avg}(i), t_{START}(i)\}$, i=1, 2 ..., $N_{OFF}$.
  Calculate the durations of each OFF cycle $t_{OFF}$, the corresponding average $T_{out}$ (rounded to 1° F.) and the start time $t_{start}$.
  If the difference between maximum and minimum $T_{out}$ during an OFF cycle is greater than $\Delta t_{OFF}$ (e.g. 4° F.), discard $S_{OFF}(i)$.
  if $t_{OFF} > \Delta t_{OFF,max}$ (e.g. 60 min) or $t_{OFF} < \Delta t_{OFF,min}$ (e.g. 5 min), discard $S_{OFF}(i)$.

Step 5. Derive HVAC nighttime database.
  Calculate the number of all ON cycles $N_{ON,\ NIGHT}$ in $S_{ON}(i)$, i=1, 2 ..., $N_{ON}$ when $t_{START}(i)$ is between 6 PM and 6 AM (may change in different seasons). Calculate the number of all OFF cycles $N_{OFF,\ NIGHT}$ in $S_{OFF}(i)$, i=1, 2 ..., $N_{OFF}$ when $t_{START}(i)$ is between 6 PM and 6 AM (may change in different seasons).
  If $N_{ON,NIGHT} < N_{ON,NIGHT,min}$ (e.g. 5 min) or $N_{OFF,NIGHT} < N_{OFF,NIGHT,min}$ (e.g 5 min), discard the data set.

Step 6. Derive HVAC whole-day database.
  Calculate the number of all ON cycles $N_{ON,\ DAY}$ in $S_{ON}(i)$, i=1, 2 ..., $N_{ON}$ when $t_{START}(i)$ is between 6 AM and 6 PM (may change in different seasons). Calculate the number of all OFF cycles $N_{OFF,\ DAY}$ in $S_{OFF}(i)$, i=1, 2 ..., Now when $t_{START}(i)$ is between 6 AM and 6 PM (may change in different seasons).
  If $N_{ON,NIGHT} < N_{ON,NIGHT,min}$ (e.g 2 min) or $N_{OFF,NIGHT} < N_{OFF,NIGHT,min}$ (e.g 5 min) or $N_{ON,DAY} < N_{ON,DAY,min}$ (e.g 2 min) or $N_{OFF,DAY} < N_{OFF,DAY,min}$ (e.g 5 min), discard the datasets.

Step 7. Repeat Step 1 through Step 6 for all datasets in each house.

Figure 4:
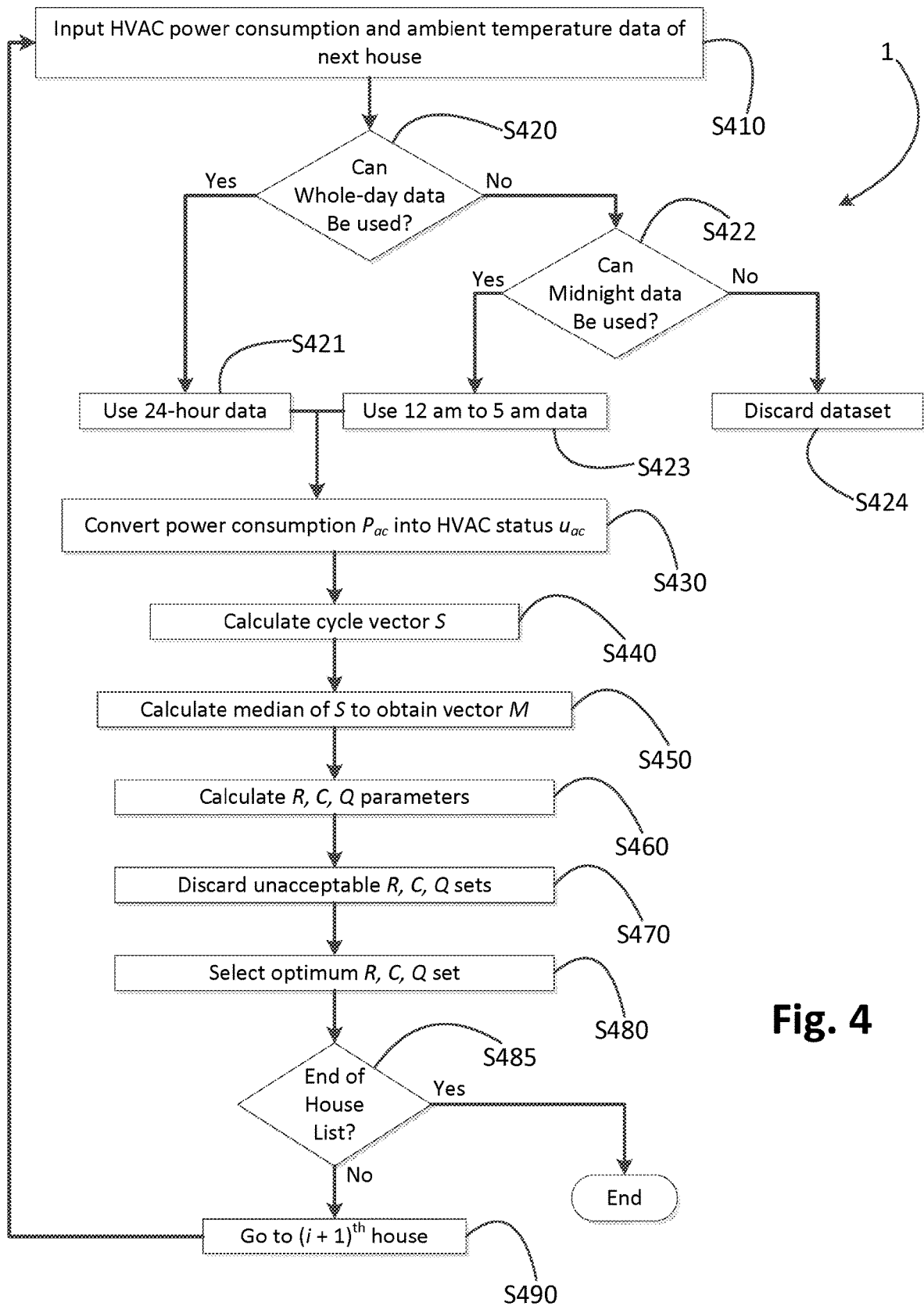
FIG. 4 is a flowchart of Algorithm 1 illustrating six steps in an RCQ parameter estimation process for the first order ETP model according to one embodiment.

FIG. 4 is a flowchart of Algorithm 1 illustrating process steps in an RCQ parameter estimation process for the first order ETP model of an HVAC unit. The process steps of Algorithm 1 can be implemented on a power ETP model processor 130 or other similar processor having circuitry configured to implement the process steps of Algorithm 1. An HVAC unit is described for illustrative purposes only. Other power units, such as a hot water heater and a refrigerator can also be incorporated with the process steps of Algorithm 1.

In step S410, HVAC power consumption data and ambient temperature data are input for a next house. Algorithm 1 is described using residential houses as the structure in which the power unit is located. However, other physical structures or buildings, such as business structures, commercial buildings, and warehouses can also be incorporated within Algorithm 400.

In step S420, it is determined whether whole-day data can be used. If whole-day data can be used (a "YES" decision in step S420), 24-hour data is selected in step S421. If whole-day data cannot be used (a "NO" decision in step S420, it is determined whether midnight data can be used in step S422. If midnight data can be used (a "YES" decision in step S422), 12:00 am to 5:00 am data is selected in step S423. If midnight data cannot be used (a "NO" decision in step S422), the dataset is discarded in step S424.

Obtain the HVAC ON/OFF Curves

In step S430, the HVAC power consumption data is converted into HVAC status using Equation (5) where $P_{ac,max}$ is the maximum power consumption during t∈τ and τ is the set of total time horizon of input data;
  $u_{ac}$ is the HVAC status.

Build a Cycling Characteristic Vector S

In step S440, a cycle vector S is calculated. The duration of each ON and OFF cycle, $t_{ON}$ and $t_{OFF}$ is calculated, as well as the corresponding average outdoor temperature $T_{out\_avg}$ during each ON or OFF cycle. Each $T_{out\_avg}$ was rounded to its nearest integer value. $t_{ON}(i)$, $t_{OFF}(i)$ and $T_{out\_avg}$ were stored in the cycling characteristic vector, S(i) for the cycle i. Consistent with embodiments described herein, an outdoor temperature can refer to a temperature outside of a physical structure in which the HVAC unit or other power unit is located.

Figure 5:
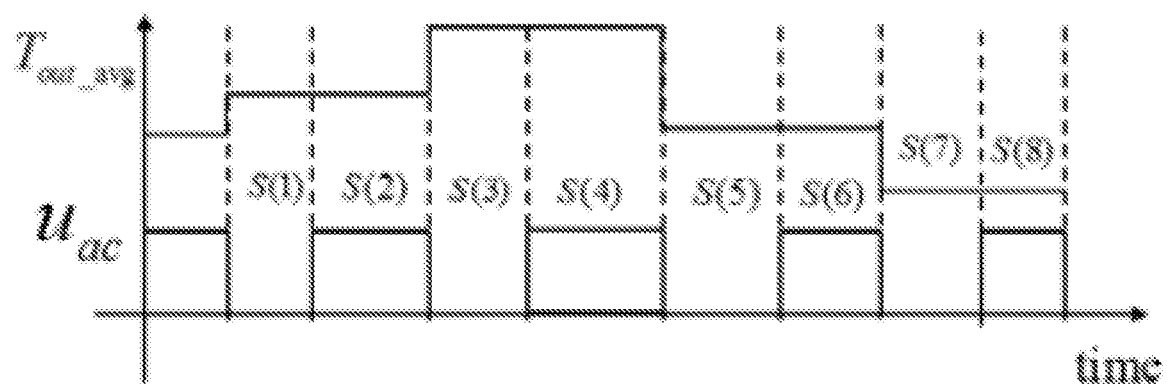
FIG. 5 is a graph illustrating an example of the cycling characteristic vector S matrix according to one embodiment.

When the difference between the maximum and minimum outdoor temperatures in an ON or OFF cycle was greater than a threshold, $\Delta T_{out}$, this cycle was discarded to eliminate outliers. A value of $\Delta T_{out}=4°$ F. was used because the RCQ values may not be representative when the temperature varies a lot within a cycle. FIG. 5 is a graph illustrating an example of the cycling characteristic vector S matrix, which is also illustrated in Table I.

TABLE I

| An Example of Vector S | | | | | | | |
|---|---|---|---|---|---|---|---|
| S(i) | S(1) | S(2) | S(3) | S(4) | S(5) | S(6) | ... |
| $t_{ON}(i)$ | NA | 14 min | NA | 17 min | NA | 13 min | ... |
| $t_{OFF}(i)$ | 10 min | NA | 11 min | NA | 15 min | NA | ... |
| $T_{out\_avg}(i)$ | 85° F. | 85° F. | 89° F. | 89° F. | 84° F. | 81° F. | ... |

Correlate $t_{ON}$ and $t_{OFF}$ with $T_{out\_avg}$

Figure 6A:
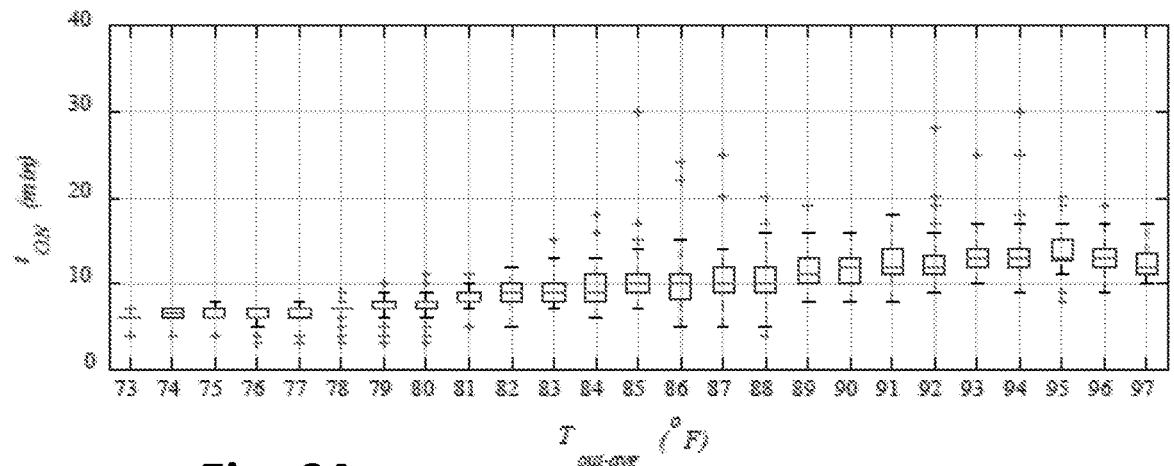
FIG. 6A is a boxplot of the ON duration with respect to different outdoor temperatures ($T_{out}$) according to one embodiment.
Figure 6B:
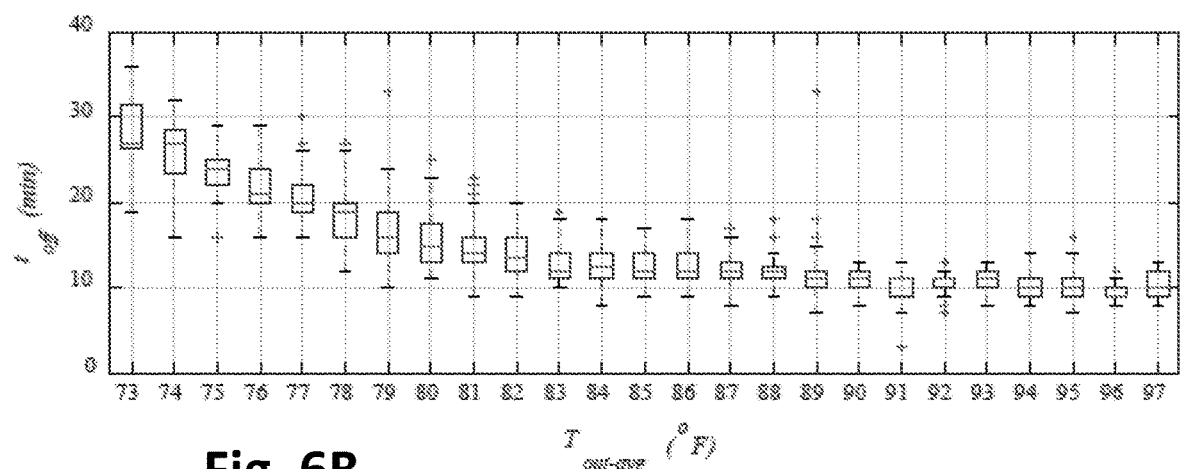
FIG. 6B is a boxplot of the OFF duration with respect to different outdoor temperatures according to one embodiment.
Figure 6C:
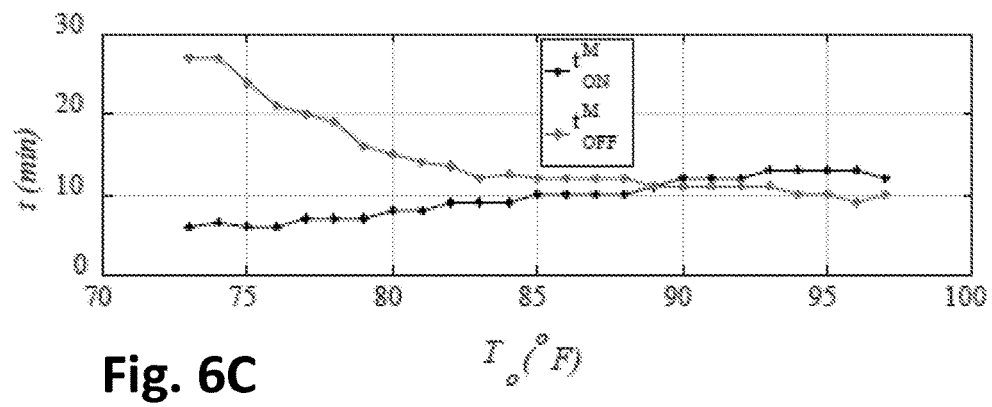
FIG. 6C is a graph illustrating the median value of $t_{ON}^M$ and $t_{OFF}^M$ with respect to different outdoor temperatures, where the median value sets of a complete ON cycle, $t_{ON}$ and a complete OFF cycle, $t_{OFF}$ are named as $t_{ON}^M$ and $t_{OFF}^M$ according to one embodiment.

In step S450 of FIG. 4, a median value of S is calculated to obtain vector M. The median values of $t_{ON}$ and $t_{OFF}$ were selected for each $T_{out\_avg}$ in S to obtain a new vector M. M was used to derive the correlation between $(t_{ON}, t_{OFF})$ and $T_{out\_avg}$ when $t_{ON}$ or $t_{OFF}$ was missing for a certain $T_{out\_avg}$. The $T_{out\_avg}$ was not included in M. An example of M is illustrated in Table II. The outdoor temperature set in M was renamed as $T_o$. The median value sets of $t_{ON}$ and $t_{OFF}$ were named as $t_{ON}$ and $t_{OFF}$. FIG. 6A is a boxplot of the ON duration with respect to different outdoor temperatures. FIG. 6B is a boxplot of the OFF duration with respect to different values of $T_{out}$, where $T_{out}$ is the outdoor temperature. FIG. 6C is a graph illustrating the median value of $t_{ON}^M$ and $t_{OFF}^M$ with respect to different outdoor temperatures.

TABLE II

An Example of Vector M

| M(i) | M(1) | M(2) | M(3) | M(4) | M(5) | M(6) | ... |
|---|---|---|---|---|---|---|---|
| $t^M_{ON}(i)$ | 10 min | 10 min | 11 min | 11 min | 12 min | 13 min | ... |
| $t^M_{OFF}(i)$ | 35 min | 30 min | 27 min | 27 min | 18 min | 19 min | ... |
| $T_o(i)$ | 75° F. | 76° F. | 77° F. | 78° F. | 88° F. | 89° F. | ... |

Derive RCQ Parameters

In step S460 of FIG. 4, R, C, and Q parameters are calculated. At each outdoor temperature $T_{out} \in T_o$, there are a set of $t_{ON}^M$ and $t_{OFF}^M$ parameters. Since Q represents the heat flow contributed by the HVAC unit, the value of Q only influences the ON cycles. In a curve fitting process, the RCQ values no longer represent accurately their physical characteristics compared to a physics-based model approach. Therefore, a value of Q=−500 was selected for all the households. Only the values of R and C were tuned. Therefore, from equations (3) and (4), when the value of Q is fixed, R and C can be calculated as $$R = \frac{T^- - T_{out} + (T^+ - T_{out}) \times e^{-t_{ON}^M \times \ln\left(\frac{T^- - T_{out}}{T^+ - T_{out}}\right) / t_{OFF}^M}}{Q \times \left(1 - e^{-t_{ON}^M \times \ln\left(\frac{T^- - T_{out}}{T^+ - T_{out}}\right) / t_{OFF}^M}\right)} \quad (6)$$

$$C = \frac{t_{OFF}^M}{\ln\left(\frac{T^- - T_{out}}{T^+ - T_{out}}\right) \times R} \quad (7)$$

For embodiments described herein, it was assumed that for each HVAC unit, $T^+$ and $T^-$ were chosen to be 72° F. and 68° F., respectively. There are two observations when selecting the value for Q. First, Q is only a variable that influences the length of the HVAC ON cycle because in the OFF cycle, the room temperature decay is unrelated with the HVAC power consumption. Second, from equations (6) and (7), it can be deduced that if the problem is treated as a curve fitting problem instead of considering the physical meanings of RCQ parameters, an arbitrary value can be selected for Q to calculate a corresponding set of values for R and C while the measured ON/OFF cycling characteristics can still be reproduced by the corresponding Decoupled-ETP model. Therefore, although −500 was selected as the value of Q, others can select another value, for example −1000 or −1500. They will obtain another set of R and C values that can also produce the same curve fitting results at the given $T_{out}$. However, in the following step, $T_{out}$ was varied from min ($T_o$) to max($T_o$). When the RCQ values failed to produce satisfactory results under other outdoor temperatures, they were excluded in the following step.

Discard the Bad RCQ Sets

In step S470, unacceptable R, C, and Q sets are discarded. A bad set of RCQ values will fail to reproduce the HVAC cycling characteristic when $T_{out}$ varies from min($T_o$) to max($T_o$). The following two criteria are used to exclude the bad set of RCQ values obtained.

In Criterion A to meet the HVAC capacity requirement, equation (1) is rewritten as $$t_{ON} = -R \times C \times \ln\left(\frac{T_{out} + Q \times R - T^-}{T_{out} + Q \times R - T^+}\right) \quad (8)$$

$$t_{OFF} = -R \times C \times \ln\left(\frac{T_{out} - T^+}{T_{out} - T^-}\right) \quad (9)$$

The antilogarithm of a logarithm function in equations (8) and (9) needs to be positive when $T_{out}$ ranges from min($T_o$) to max($T_o$), which results in $$Q \times R > T^+ - T_{out} \quad (10)$$

Figure 7A:
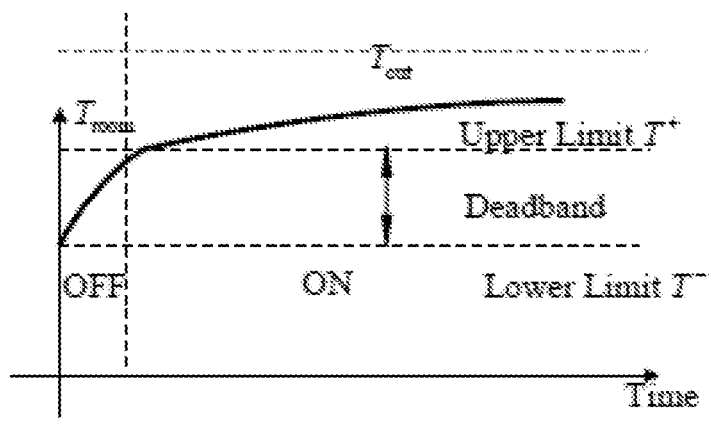
FIG. 7A is a graph illustrating a set of RCQ values when Criterion A cannot be met, where R represents thermal resistance, C represents thermal capacitance, and Q represents heat flow according to one embodiment.

FIG. 7A is a graph illustrating a set of RCQ values when Criterion A cannot be met. The physical meaning implies that the HVAC unit is undersized and it can no longer bring the room temperature down to T when the outdoor temperature is too high. Therefore, any set of RCQ values that violate the Criterion A need to be discarded.

Figure 7B:
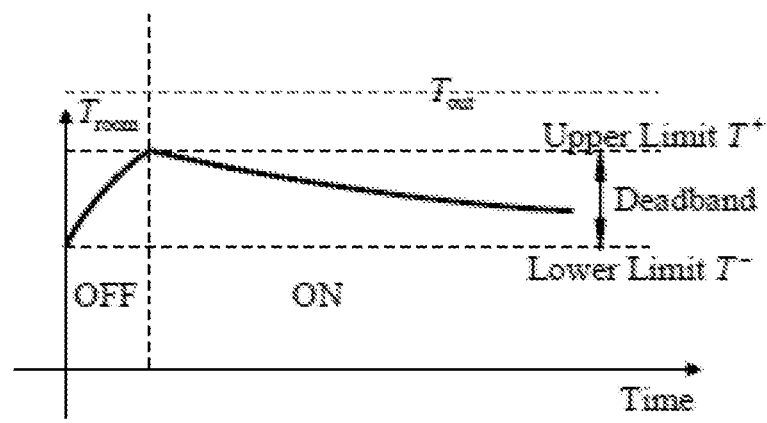
FIG. 7B is a graph illustrating the criterion to ensure that when modeling the HVAC set point changes, $t_{ON}$ and $t_{OFF}$ will change according to one embodiment.

In Criterion A, the modeling set point change requirement is met. FIG. 7B is a graph illustrating the criterion A to ensure that when modeling the HVAC set point changes (e.g. [$T^-$, $T^+$] changes to [$\overline{T}^-$, $\overline{T}^+$]), $t_{ON}$ and $t_{OFF}$ will change accordingly. Mathematically, if $\overline{T}^+ = T^+ + \Delta T$ and $\overline{T}^- = T^- + \Delta T$, the following equations hold $$\bar{t}_{ON} - t_{ON} > f_{ON}(\Delta T, T_{out}) \quad (11)$$

$$\bar{t}_{OFF} - t_{OFF} > f_{OFF}(\Delta T, T_{out}) \quad (12)$$

where $f_{ON}(\Delta T, T_{out})$ and $f_{OFF}(\Delta T, T_{out})$ are functions that determine the minimum changes of $t_{ON}$ and $t_{OFF}$ with respect to the HVAC set point change, $\Delta T$, and $T_{out}$. Note that $\bar{t}_{ON}$ and $\bar{t}_{OFF}$ are calculated from equations (8) and (9) by replacing $T^-$ and $T^+$ with $\overline{T}^-$ and $\overline{T}^+$. Any set of RCQ values that violate Criterion A are discarded.

Select the Best RCQ Set

Figure 8:
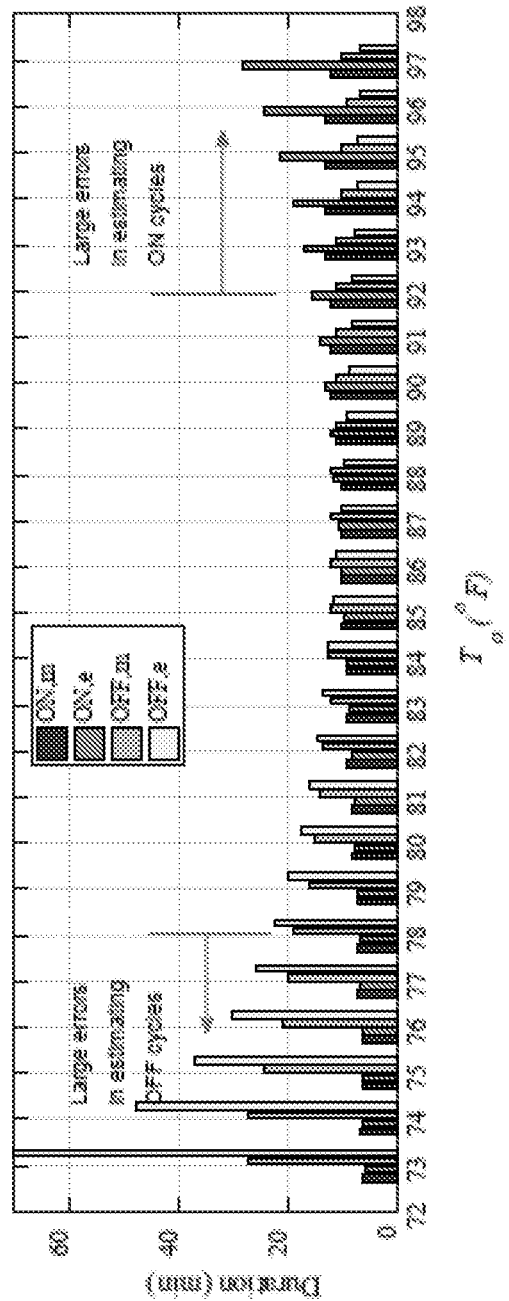
FIG. 8 is a bar graph comparing the median of the measured ON/OFF durations, $t_{ON}^M$ and $t_{OFF}^M$ and the estimated ON/OFF durations, $t_{ON}^{\approx M}$ and $t_{OFF}^{\approx M}$ using the best RCQ set according to one embodiment.

In step S480 of FIG. 4, an optimum R, C, and Q set is selected. The best RCQ set (defined as $R_f$, $C_f$ and $Q_f$ obtained at outdoor temperature $T_f$, wherein $T_f$ is a specific $T_{out}$ that generates $R_f$, $C_f$, and $Q_f$) in the N remaining sets can be selected by minimizing the error between the estimated and actual ON/OFF durations using $$\min \sum_{T_{out} \in T_o} \left[ (\bar{t}_{ON}(T_{out}) - t_{ON}^M(T_{out}))^2 + (\bar{t}_{OFF}(T_{out}) - t_{OFF}^M(T_{out}))^2 \right] \quad (13)$$

where $\bar{t}_{ON}(T_{out})$ and $\bar{t}_{OFF}(T_{out})$ are the estimated ON and OFF durations under outdoor temperature $T_{out}$ calculated using equations (8) and (9); $t_{ON}^M(T_{out})$ and $t_{OFF}^M(T_{out})$ are the median value of ON/OFF durations under $T_{out}$ from actual measurements, which can be found in Vector M. An optimum $R_f C_f Q_f$ parameter set and a corresponding $R_f C_f Q_f$ parameter outdoor temperature, $T_f$ can be determined in which the converted power activated time cycles and the converted power non-activated time cycles match within a predefined margin of error actual power activated time cycles and actual power non-activated time cycles, respectively. By calculating the optimum RCQ sets in step S480, one set of R, C, and Q is obtained for one HVAC unit or other TCA; this set is labeled as $R_f$, $C_f$, and $Q_f$. These values of $R_f$, $C_f$, and $Q_f$ are subsequently used as inputs for the Decoupled-ETP model. FIG. 8 is a bar graph comparing the median of the measured ON/OFF durations, $t_{ON}^M$ and $t_{OFF}^M$ (ON,m and OFF,m in FIG. 8) and the estimated ON/OFF durations, $t_{ON}^{\approx M}$ and $t_{OFF}^{\approx M}$ (ON,e and OFF,c in FIG. 8) using the best $R_f C_f Q_f$ set. In this case, the $R_f C_f Q_f$ values were derived when the outdoor temperature was 84° F.

From the comparison, the following observations can be made.

The model illustrated in FIG. 8 calculated ON/OFF durations fit the measurements well when 80° F.≤$T_{out}$≤93° F.

However, when $T_{out}$<80° F., the estimated OFF cycle durations were significantly longer than the measured ones. When $T_{out}$>93° F., the estimated ON cycle durations were significantly longer than measured ones.

This occurred when using the first order to approximate a higher order thermal dynamic process because the nonlinearity of the actual thermal dynamic process caused the estimated $\bar{t}_{ON}$ and $\bar{t}_{OFF}$ to deviate from the measured $t_{ON}^M$ and $t_{OFF}^M$ more and more. This occurred when $T_{out}$ was significantly higher or lower than $T_f$, at which temperature the RCQ parameters were derived. To resolve this modeling issue, a Decoupled-ETP model is described herein.

In step S485, it is determined whether the current house considered is the last house on a list of houses to be processed. If the current house is the last house (a "YES" decision in step S485), the process ends. If the current house is not the last house (a "NO" decision in step S485), a counter is used to go to the (i+1)$^{th}$ house in step S490. The process begins over at step S410 with the (i+1)$^{th}$ house.

The following exemplary algorithm may be used for selecting parameters for ETP HVAC models according to embodiments described herein.

Exemplary Algorithm 1: Selecting Parameters for ETP HVAC Models

Step 1. Input $S_{ON}$ and sort $S_{ON}$ by $T_{out}$.
Step 2. Calculate $M_{ON}(i)=\{t_{ON}^M(i), T_0(i))\}$ and $M_{OFF}(i)=\{t_{OFF}^M, T_0(i)\}$)
  $t_{ON}^M(i)$ is the mean value of all $t_{ON}(i)$ under the same $T_{out, avg}$ in $S_{ON}$ and $T_0(i)$ is $T_{out, avg}$.
  $t_{OFF}^M(i)$ refers to the mean value of all $t_{OFF}(i)$ under the same $T_{out, avg}$ in $S_{ON}$ and $T_0(i)$ is $T_{out, avg}$.
Step 3. Calculate $M(i)=\{t_{ON}^M(i), t_{OFF}^M(i), T_0(i)\}$, i=1, 2, . . . , $N_M$, if $T_0(i)$ in $M_{ON}(i)$ and $M_{OFF}(i)$ are the same.
Step 4. Calculate RCQ parameters for each on/off cycle pair $\{t_{ON}^M(i), t_{OFF}^M(i)\}$ in M(i) at $T_0(i)$ using Equations (6)-(7).
  Assume Q=−500, T$^+$=72° F., and T$^-$=68° F. Calculate NM sets of R and C values based on Equations (6)-(7), where $T_{out}=T_0(i)$, $t_{ON}^M=t_{ON}^M(i)$ and $t_{OFF}^M=t_{OFF}^M(i)$, i=1, 2, . . . , $N_M$.

$$R = \frac{T^- - T_{out} + (T^+ - T_{out}) \times e^{-t_{ON}^M \times \ln\left(\frac{T^- - T_{out}}{T^+ - T_{out}}\right)/t_{OFF}^M}}{Q \times \left(1 - e^{-t_{ON}^M \times \ln\left(\frac{T^- - T_{out}}{T^+ - T_{out}}\right)/t_{OFF}^M}\right)} \quad (6)$$

$$C = \frac{t_{OFF}^M}{\ln\left(\frac{T^- - T_{out}}{T^+ - T_{out}}\right) \times R} \quad (7)$$

Step 5. For each set of R, C and Q obtained in Step 4, calculate if Equation (10) is satisfied, for T$^+$=72° F. $T_{out}$ ranges from min{$T_0(i)$} to max{$T_0(i)$} in M(i), i=1, 2, . . . , $N_M$. If not, this set of R, C and Q will be discarded.

$$Q \times R > T^+ - T_{out} \quad (10)$$

Step 6. For each remaining set of R, C and Q after Step 5, calculate if Equation (11) is satisfied. If not, this set of R, C and Q will be discarded.

$$\bar{t}_{ON} - t_{ON} > f_{ON}(\Delta T, T_{out}) \quad (11)$$

$$\bar{t}_{OFF} - t_{OFF} > f_{OFF}(\Delta T, T_{out}) \quad (12)$$

Step 7. For each remaining set of R, C and Q after Step 6, select the set of R, C and Q which minimized Equation (13), where $\bar{t}_{ON}(T_{out})$ and $\bar{t}_{OFF}(T_{out})$ are calculated, $t_{ON}^M(i)$ can be found in M(i). The selected R, C and Q are named $R_f$, $C_f$ and $Q_f$.

$$\sum_{i=1}^{N_M} \left[ \left((\bar{t}_{ON}(i) - t_{ON}^M(i))\right)^2 + \left((\bar{t}_{OFF}(i) - t_{OFF}^M(i))\right)^2 \right] \quad (13)$$

$$\bar{t}_{ON}(i) = -R \times C \times \ln \frac{T_0(i) + Q \times R - T^-}{T_0(i) + Q \times R - T^+} \quad (13a)$$

$$\bar{t}_{OFF}(i) = -R \times C \times \ln \frac{T_0(i) - T^+}{T_0(i) - T^-} \quad (13b)$$

Step 8. Repeat Step 1 through Step 7 for all houses.

As illustrated in FIGS. 7A and 7B, the estimation errors of $\bar{t}_{ON}$ and $\bar{t}_{OFF}$ have different trends. If one $R_fC_fQ_f$ set is used for modeling both the ON and OFF cycles, a simple parameter adjustment is not feasible because when errors in $\bar{t}_{ON}$ are reduced, errors in $\bar{t}_{OFF}$ will increase. From equations (8) and (9), $t_{ON}$ is related with $R_f$, $C_f$, $Q_f$ but $t_{OFF}$ is only related with R×C. Therefore, a Decoupled-ETP model is used to separate the modeling of ON and OFF cycles. The RCQ parameters are made a function of $T_{out}$ to reduce the modeling error corresponding to the $T_{out}$ variations. Contrary to equations (1) and (2), in the Decoupled-ETP model, $T_{room}$ and $u_{ac}$ at t=k+1 are calculated as:

$$T_{room}(k+1) = \quad (14)$$
$$\begin{cases} T_{out}(k+1) + f_Q(T_{out}) \times R_f - e^{-\Delta t/(R_f \times C_f)} \times \\ \quad (T_{out}(k) + f_Q(T_{out}(k)) \times R_f - T_{room}(k)) & \text{if } u_{ac}(k) = 1 \\ T_{out}(k) - (T_{out}(k) - T_{room}(i)) \times e^{-\Delta t/f_{RC}(T_{out}(k))} & \text{if } u_{ac}(k) = 0 \end{cases}$$

$$u_{ac}(k+1) = \begin{cases} 1 & \text{if } T_{room}(k+1) < T^- \\ 0 & \text{if } T_{room}(k+1) > T^+ \\ u_{ac}(k) & \text{else} \end{cases} \quad (15)$$

When $T_{out}$ is constant, equation (14) can be rewritten as:

$$T = T_{out} + f_Q(T_{out}) \times R_f - (T_{out} + f_Q(T_{out}) \times R_f - T^+) \times e^{-tON/(R_f \times C_f)} \quad (16)$$

$$T^+ = T_{out} - (T_{out} - T^-) \times e^{-tOFF/f_{RC}(T_{out})} \quad (17)$$

where $R_f$, $C_f$ can be obtained above. The modifications are discussed herein as follows.

Figure 9A:
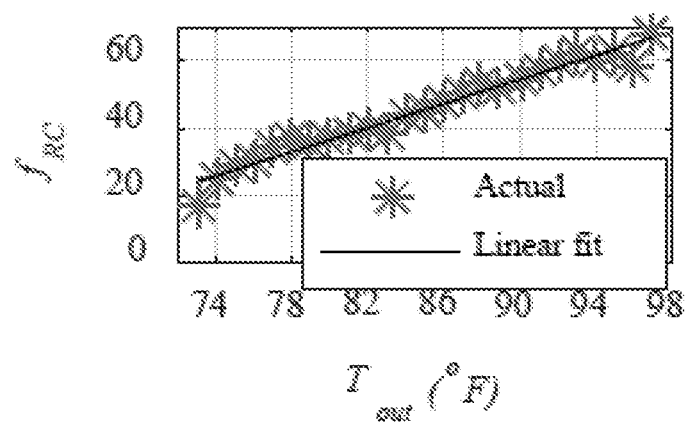
FIG. 9A is a graph illustrating linear correlation between R×C and $T_{out}$ according to one embodiment.

For the OFF cycle, define $R_f \times C_f = f_{RC}(T_{out})$ such that the $R_f$ $C_f$ value is a function of $T_{out}$. From equation (17), $$\hat{t}_{OFF} = -f_{RC}(T_{out}) \times \ln\left(\frac{T_{out} - T^+}{T_{out} - T^-}\right) \quad (18)$$

where $\hat{t}_{OFF}$ is the estimated OFF duration by using the Decoupled-ETP model. The relationship between $f_{RC}$ and $T_{out}$ is found. By calculating $R_f \times C_f$ values under each $T_{out}$ using the method illustrated above, the linear correlation between $R_f \times C_f$ and $T_{out}$ derived from the data of one hundred houses is calculated. The mean correlation coefficient is 0.973 and the standard deviation is 0.0253. FIG. 9A is a graph illustrating actual values and the linear correlation between $R_f \times C_f$ and $T_{out}$. Therefore, the linear regression model used to calculate $f_{RC}(T_{out})$ is $$f_{RC}(T_{out}) = k_{RC} \times T_{out} + b_{RC} \qquad (19)$$

To avoid modeling temperature sensitivity of all three RCQ parameters, let $R=R_f$ and $C=C_f$ (obtained above) to derive the ON cycle RCQ parameter. When the values of R and C are fixed, Q is made a function of $T_{out}$, leading to $$Q(T_{out}) = \frac{(T_{out} - T^+) \times e^{-t_{ON}^M/(R+C)} + T^- - T_{out}}{R \times \left[1 - e^{-t_{ON}^M/(R \times C)}\right]} \qquad (20)$$

Figure 9B:
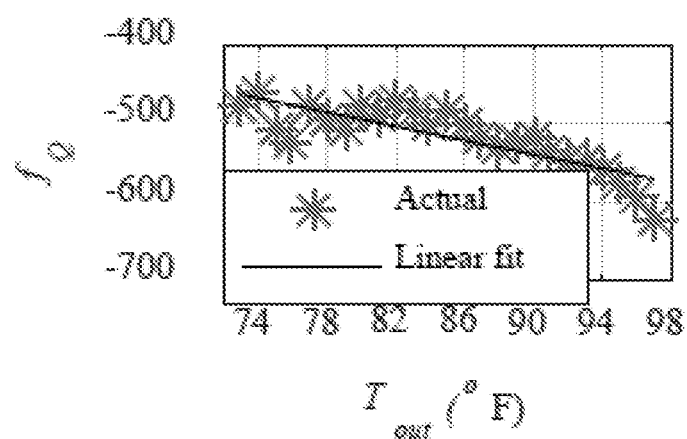
FIG. 9B is a graph illustrating linear correlation between Q and $T_{out}$ according to one embodiment.

The correlation between Q and $T_{out}$ derived from the one hundred houses was calculated. The mean of correlation coefficient was 0.941 and the standard deviation was 0.048. FIG. 9B is a graph illustrating linear correlation between Q and $T_{out}$. The linear regression model used to calculate Q for each $T_{out}$ is $$f_Q(T_{out}) = k_Q \times T_{out} + b_Q \qquad (21)$$

After Q is calculated for each $T_{out}$ using equation (21), the estimated ON cycle duration, $\hat{t}_{ON}$, can be calculated as $$\hat{t}_{ON} = -R_f \times C_f \times \ln\left(\frac{T_{out} + f_Q(T_{out}) \times R_f - T^-}{T_{out} + f_Q(T_{out}) \times R_f - T^+}\right) \qquad (22)$$

Figure 10:
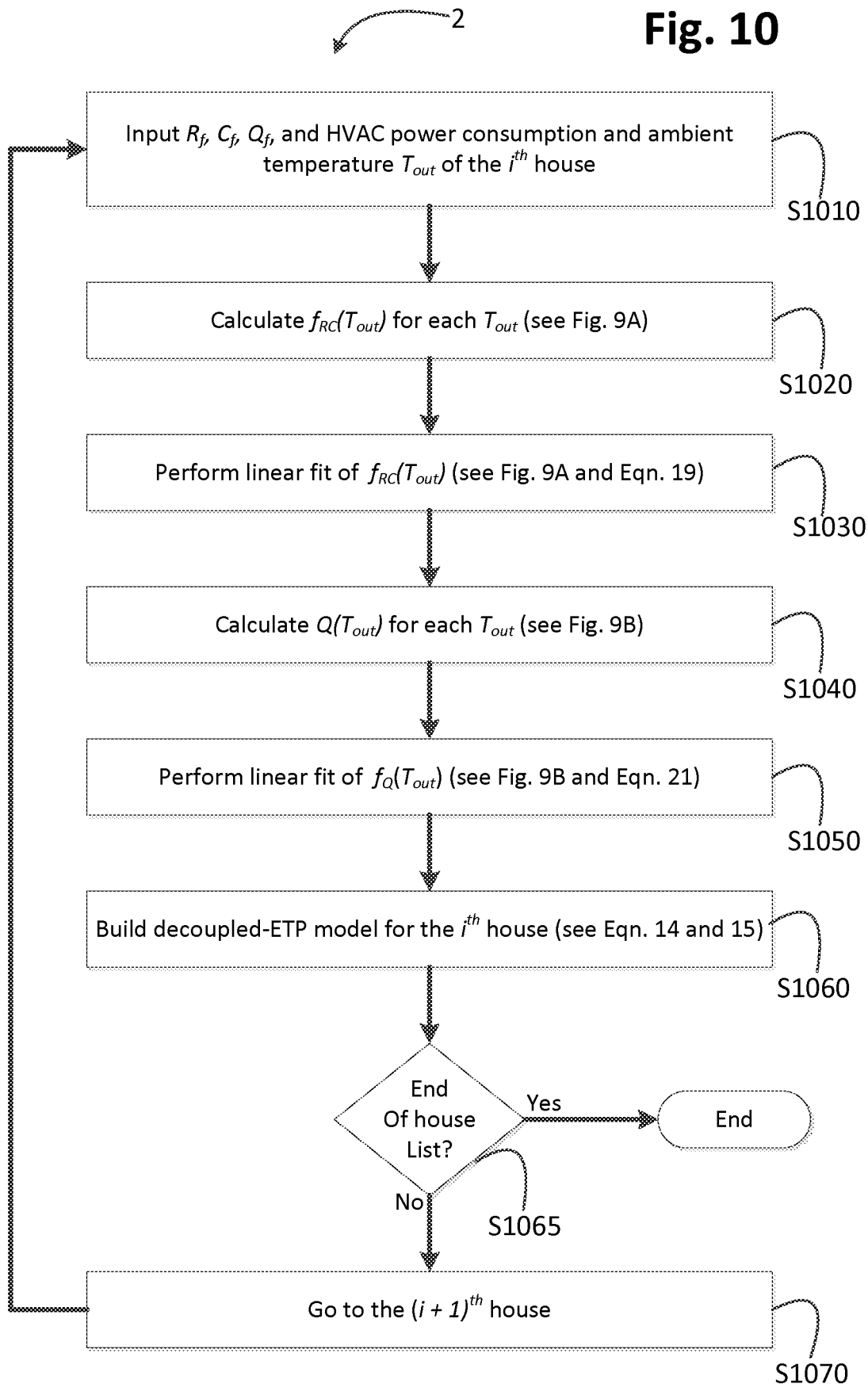
FIG. 10 is a flow chart of Algorithm 2 of a Decoupled-ETP model according to one embodiment.

FIG. 10 is a flow chart of Algorithm 2 for a Decoupled-ETP model. The process steps of Algorithm 2 can be implemented on a power Decoupled-ETP model processor 140 or other similar processor having circuitry configured to implement the process steps of Algorithm 2.

In step S1010, $R_f$, $C_f$, $Q_f$ and HVAC power consumption and ambient temperature $T_{out}$ of the $i^{th}$ house are input. Input parameters $R_f$, $C_f$, $Q_f$ are calculated as described herein with reference to step S480 in FIG. 4. HVAC power consumption and ambient temperature $T_{out}$ are obtained from the HVAC consumption database 120 for the $i^{th}$ house.

In step S1020, $f_{RC}(T_{out})$ is calculated.

$$\text{Calculate } f_{RC}(T_{out}) = -t_{OFF}^M / \ln\left(\frac{T_{out} - T^+}{T_{out} - T^-}\right) \text{ under each } T_{out} \qquad (23)$$

where $T_{out}$, $T_{off}$, and M are calculated from step S450 in FIG. 4

FIG. 9A is a graph illustrating actual calculated results of $f_{RC}(T_{out})$ for each $T_{out}$.

In step S1030, a linear fit is performed of $f_{RC}(T_{out})$ for each $T_{out}$, an example of which is illustrated in FIG. 9A.

In step S1040, $Q(T_{out})$ is calculated for each $T_{out}$ based on:

$$Q_f(T_{out}) = \qquad (24)$$
$$\left[(T_{out} - T^+) \times e^{-t_{ON}^M/(R_f \times C_f)} + T^- - T_{out}\right]/R_f \times \left[1 - e^{-t_{ON}^M/(R_f \times C_f)}\right]$$

where $T_{out}$, $t_{ON}^M(T_{out})$, and M are obtained in Vector M in step S450 of FIG. 4.

FIG. 9B is a graph illustrating actual calculated results of $Q(T_{out})$ for each $T_{out}$.

In step S1050, a linear fit of $Q(T_{out})$ is performed for each $T_{out}$, an example of which is illustrated in FIG. 9B.

In step S1060, a Decoupled-ETP model is built for the $i^{th}$ house.

$$T_{room}(k+1) = \qquad (25)$$
$$\begin{cases} T_{out}(k+1) + f_Q(T_{out}) \times R_f - e^{-\Delta t/(R_f \times C_f)} \times \\ \quad (T_{out}(k) + f_Q(T_{out}(k)) \times R_f - T_{room}(k)) & \text{if } u_{ac}(k) = 1 \\ T_{out}(k) - (T_{out}(k) - T_{room}(i)) \times e^{-\Delta t/f_{RC}(T_{out}(k))} & \text{if } u_{ac}(k) = 0 \end{cases}$$

$$\text{where } u_{ac}(k+1) = \begin{cases} 1 & \text{if } T_{room}(k+1) < T^- \\ 0 & \text{if } T_{room}(k+1) > T^+ \\ u_{ac}(k) & \text{else} \end{cases}$$

In step S1065, it is determined whether an end of a list of houses has been reached. If the end of the house list has been reached (a "YES" decision in step S1065), the process ends. If the end of the house list has not been reached (a "NO" decision in step S1065) the process continues to step S1070.

In step S1070, a counter increments to the $(i+1)^{th}$ house and Algorithm 2 returns to step S1010 to repeat the process for the next house.

The following exemplary algorithm may be used for deriving the Decoupled-ETP model according to embodiments described herein.

Exemplary Algorithm 2: Deriving the Decoupled-ETP Model

Step 1. Input dataset of the $i^{th}$ (i=1, 2, . . . , $N_{house}$) house and repeat Step 1 through Step 7 in Algorithm 1.

Step 2. For each remaining set of R, C and Q after Step 6 in Algorithm 1, build Vector $D_{RC}(i)=(R(i), C(i), Q(i), t_{ON}^M(i), t_{OFF}^M(i), T_0(i))$, i=1, 2, . . . , $N_D$, where $t_{ON}^M(i)$, $t_{OFF}^M(i)$, $T_0(i)$ are the corresponding dataset in M(i) to obtain R(i), C(i), Q(i).

$$\text{Step 3. Calculate } \tilde{f}_{RC}(i) = R(i) \times C(i), i=1,2, \ldots, N_D \qquad (26)$$

Step 4. Use linear regression $f_{RC}(T_{out}) = k_{RC} \times T_{out} + b_{RC}$ to fit the relation between $\tilde{f}_{RC}(i)$ and $T_0(i)$, i=1, 2, . . . , $N_D$.

Step 5.

$$\text{Calculate } \tilde{f}_Q(i) = \frac{(T_0(i) - T^+) \times e^{\frac{-t_{ON}^M(i)}{R(i) \times C(i)}} + T^- - T_0(i)}{R(i) \times \left[1 - e^{\frac{-t_{ON}^M(i)}{R(i) \times C(i)}}\right]}, i = 1, 2, \ldots, N_D \qquad (27)$$

Step 6. Use linear regression $f_Q(T_{out}) = k_Q \times T_{out} + b_Q$ to fit the relation between $\tilde{f}_Q(i)$ and $T_0(i)$, i=1, 2, . . . , $N_D$.

Step 7. Build the Decoupled ETP model based on Equations (14)-(15).

Step 8. Repeat Step 1 through Step 7 for all datasets in each house.

Figure 11:
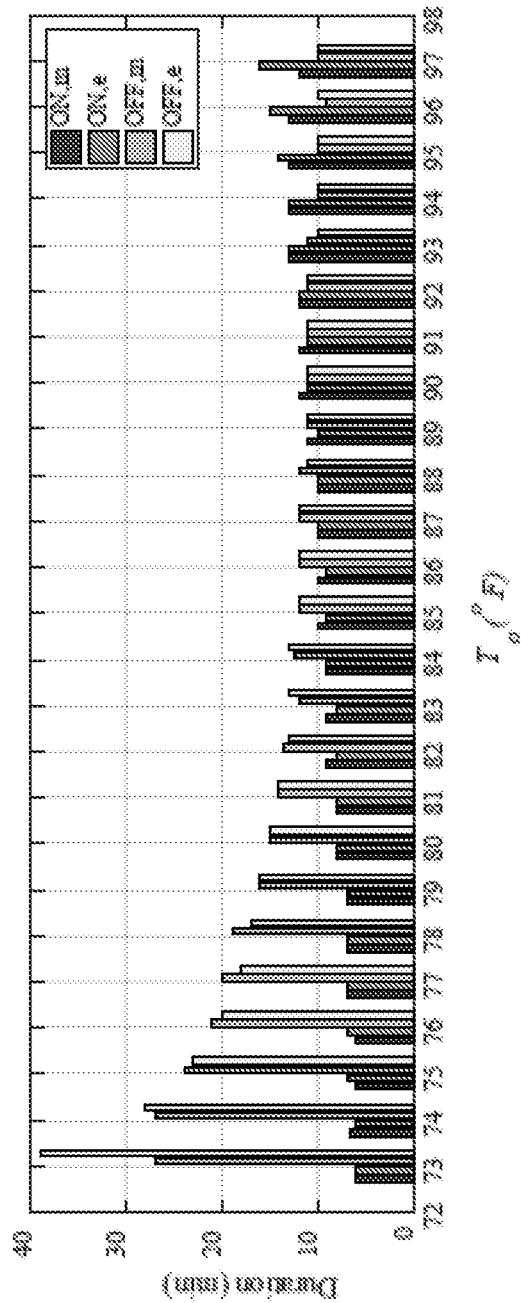
FIG. 11 is a bar graph illustrating a comparison between the estimated ON and OFF durations and the median of the actual ON/OFF durations with respect to outdoor temperature according to one embodiment.

FIG. 11 is a bar graph illustrating a comparison between the estimated ON and OFF durations and the median of the actual ON/OFF durations with respect to outdoor temperature. Compared with FIG. 8 for the ETP model, the accuracy of the prediction of the Decoupled-ETP model is significantly improved. The validation test for the one hundred houses was run using the PECAN street data set. The average errors between actual median of $t_{ON}$ and $t_{OFF}$ and the estimated $\hat{t}_{ON}$ and $\hat{t}_{OFF}$ were calculated. The average error among the one hundred houses over the full range of $T_{out}$ values was 4.02 and 2.05 minutes for the ETP model and the Decoupled-ETP model, respectively. If considering only the low ($T_{out}$<76° F.) or the high ($T_{out}$>95° F.) outdoor temperature cases, the modeling error of the Decoupled-ETP model is normally 10-20 minutes less than that of the ETP model.

The Decoupled-ETP model can be applied to model all TCAs as long as the consumptions are regulated by a consistent thermostat setting without being distorted by activities of occupants, such as opening the doors or windows for a prolonged period, frequently changing thermostat set points, or manually shutting down the TCA devices, etc. However, in practice, TCA operations during daytime can heavily be distorted by human activities, as illustrated in FIGS. 3A and 3C. For most houses, the most usable data for deriving TCA models are the data measured between midnight and early morning when the occupants are asleep, such that the influence of their activities is a minimum. However, for an HVAC unit, using only the midnight data can cause an inaccuracy since it does not account for the impact of solar radiations on the thermal dynamics of the house.

To address this issue, an Adjusted Decoupled-ETP model is used to tune the parameters of the Decoupled-ETP model, which was derived using only the midnight data. With the Adjusted Decoupled-ETP model, the day-time operation can also be accurately modeled.

When the HVAC unit is ON, $T_{room}$ at t=k+1 can be calculated as $$T_{room}(k+1)=T_{out}(k+1)+\hat{f}_Q(T_{out})\times\hat{R}_f-(T_{out}(k)+\hat{f}_Q(T_{out}(k))\times\hat{R}_f-T_{room}(k))\times e^{-\Delta t/(\hat{R}_f\times\hat{C}_f)} \quad (28)$$

When the HVAC unit is OFF, $T_{room}$ at t=k+1 can be calculated as $$T_{room}(k+1)=T_{out}(k)-(T_{out}(k)-T_{room}(k))\times e^{-t/f_{RC}(T_{out}(k))} \quad (29)$$

where $$\hat{R}_f = K_{R_f} \times R_{f,N} \quad (30)$$

$$\hat{C}_f = K_{C_f} \times C_{f,N} \quad (31)$$

$$\hat{f}_Q(T_{out}) = K_Q(T_{out}) \times f_{Q,N}(T_{out}) \quad (32)$$

$$\hat{f}_{RC}(T_{out}) = K_{RC}(T_{out}) \times f_{RC,N}(T_{out}) \quad (33)$$

In equations (28) and (29), $R_{f,N}$, $C_{f,N}$, $f_{Q,N}(T_{out})$, and $f_{RC,N}(T_{out})$ are the parameters of the Decoupled-ETP model calculated using the midnight data set. $K_{R_f}$, $K_{C_f}$, $K_Q(T_{out})$ and $K_{RC}(T_{out})$ are the adjustment coefficients for modeling daytime HVAC cycling behaviors.

To derive these coefficients, n households with at least five days of 24-hour HVAC consumptions were selected, during which period there were no obvious distortions caused by occupants' activities. A NIGHT model and a WHOLE-DAY model represent the Decoupled-ETP model derived using the midnight data and the whole-day data, respectively. The NIGHT model parameters of the $i^{th}$ HVAC unit include $R_{f,N}^i$, $C_{f,N}^i$, $f_{Q,N}^i(T_{out})$, and $f_{RC,N}^i(T_{out})$. The WHOLE-DAY model parameters include $R_{f,D}^i$, $C_{f,D}^i$, $f_{Q,D}^i(T_{out})$, and $f_{RC,D}^i(T_{out})$.

The adjustment coefficients can be calculated as follows.

$$K_{R_f} = \text{median}\left\{\frac{R_{f,D}^1}{R_{f,N}^1}, \frac{R_{f,D}^2}{R_{f,N}^3}, ..., \frac{R_{f,D}^n}{R_{f,N}^N}\right\} \quad (34)$$

$$K_{C_f} = \text{median}\left\{\frac{C_{f,D}^1}{C_{f,N}^1}, \frac{C_{f,D}^2}{C_{f,N}^2}, ..., \frac{C_{f,D}^n}{C_{f,N}^n}\right\} \quad (35)$$

$$K_Q(T_{out}) = \text{median}\left\{\frac{g_{Q,D}^1(T_{out})}{f_{Q,N}^1(T_{out})}, \frac{g_{Q,D}^2(T_{out})}{f_{Q,N}^2(T_{out})}, ..., \frac{g_{Q,D}^n(T_{out})}{f_{Q,N}^n(T_{out})}\right\} \quad (36)$$

$$g_{Q,D}^i(T_{out}) = \frac{(T_{out}-T^+)\times e^{-t_{ON}^M/(R_{f,N}^i\times C_{f,N}^i)} + T^- - T_{out}}{R_{f,N}^i \times \left[1-e^{-t_{ON}^M/(R_{f,N}^i\times C_{f,N}^i)}\right]} \quad (37)$$

where $T_{out} \in T_o$.

To account for the saturation effect of the HVAC unit in low or high temperature ranges, a capped linear regression model is used.

$$\tilde{K}_Q(T_{out}) = \begin{cases} \tilde{k}_Q \times \min(T_o) + \tilde{b}_Q & \text{if } T_{out} < \min(T_o) \\ \tilde{k}_Q \times T_{out} + \tilde{b}_Q & \text{if } \min(T_o) \leq T_{out} \leq \max(T_o) \\ \tilde{k}_Q \times \max(T_o) + \tilde{b}_Q & \text{if } T_{out} > \max(T_o) \end{cases} \quad (38)$$

FIG. 12A is a graph illustrating an example of $$\frac{g_{Q,D}^i(T_{out})}{f_{Q,N}^i(T_{out})}$$

when i ranges from 1 to 10 and $K_Q$ with respect to $T_{out}$. FIG. 12B is a graph illustrating the linear fit model $\tilde{K}_Q$ with respect to $T_{out}$.

$K_{RC}(T_{out})$ is calculated as $$K_{RC}(T_{out}) = \text{median}\left\{\frac{f_{RC,D}^1(T_{out})}{f_{RC,N}^1(T_{out})}, \frac{f_{RC,D}^2(T_{out})}{f_{RC,N}^2(T_{out})}, ..., \frac{f_{RC,D}^n(T_{out})}{f_{RC,N}^n(T_{out})}\right\} \quad (39)$$

where $T_{out} \in T_o$. A capped second order polynomial regression model $\tilde{K}_{RC}(T_{out})$ is used to fit the relationship between $K_{RC}$ and $T_{out}$ such that $$\tilde{K}_{RC}(T_{out}) = \begin{cases} a_0 \times (\min(T_o))^2 + a_1 \times \min(T_o) + a_2 & \text{if } T_{out} < \min(T_o) \\ a_0 \times T_{out}^2 + a_1 \times T_{out} + a_2 & \text{if } \min(T_o) \leq T_{out} \leq \max(T_o) \\ a_0 \times (\max(T_o))^2 + a_1 \times \max(T_o) + a_2 & \text{if } T_{out} > \max(T_o) \end{cases} \quad (40)$$

FIG. 13A is a graph illustrating an example of $$\frac{f_{RC,D}^i(T_{out})}{f_{RC,N}^i(T_{out})}$$

when i ranges from 1 to 10 and $K_Q$ with respect to $T_{out}$. FIG. 13B is a graph illustrating the second order polynomial model $\tilde{K}_Q$ versus $T_{out}$.

When the adjustment coefficients are derived, only the middle night data is used to derive the Decoupled-ETP model parameters. The NIGHT model parameters are adjusted using equations (28) and (29) so that when modeling the daytime HVAC cycling behaviors, the impact of solar radiation can be reflected appropriately.

FIG. 14 is a flow chart of Algorithm 3 for the Adjusted Decoupled-ETP model. The process steps of Algorithm 3 can be implemented on a power Adjusted Decoupled-ETP model processor 150 or other similar processor having circuitry configured to implement the process steps of Algorithm 3.

In step S1410, n non-distorted data is input. For example, data can cover a 5-day, 24-hour period for household HVAC power consumption and ambient temperature data from the HVAC consumption database 120. FIG. 3B is a graph associated with Step 1 illustrating an acceptable HVAC consumption curve.

In step S1420, the midnight data is used to calculate the Decoupled-ETP model parameters for each household HVAC, $$R_{f,N}^i, C_{f,N}^i, f_{Q,N}^i(T_{out}), f_{RC,N}^i(T_{out}) \tag{41}$$

from estimations of Algorithm 2 (see FIG. 10).

In step S1430, whole-day data is used to calculate the Decoupled-ETP model parameters for each household HVAC, $$R_{f,D}^i, C_{f,D}^i, f_{Q,D}^i(T_{out}), f_{RC,D}^i(T_{out}) \tag{42}$$

from estimations of Algorithm 2 (see FIG. 10).

In step S1440, adjustment coefficients $K_{R_f}$, $K_{C_f}$, $K_Q(T_{out})$ and $K_{RC}(T_{out})$ are calculated based on:

$$K_{R_f} = \text{median}\left\{\frac{R_{f,D}^1}{R_{f,N}^1}, \frac{R_{f,D}^2}{R_{f,N}^2}, \ldots, \frac{R_{f,D}^n}{R_{f,N}^n}\right\} \tag{43}$$

$$K_{C_f} = \text{median}\left\{\frac{C_{f,D}^1}{C_{f,N}^1}, \frac{C_{f,D}^2}{C_{f,N}^2}, \ldots, \frac{C_{f,D}^n}{C_{f,N}^n}\right\} \tag{44}$$

$$K_Q(T_{out}) = \text{median}\left\{\frac{g_{Q,D}^1(T_{out})}{f_{Q,N}^1(T_{out})}, \frac{g_{Q,D}^2(T_{out})}{f_{Q,N}^2(T_{out})}, \ldots, \frac{g_{Q,D}^n(T_{out})}{f_{Q,N}^n(T_{out})}\right\} \tag{45}$$

$$g_{Q,D}^i(T_{out}) = \frac{(T_{out} - T^+) \times e^{-t_{ON}^M/(R_{f,N}^i \times C_{f,N}^i)} + T^- - T_{out}}{R_{f,N}^i \times \left[1 - e^{-t_{ON}^M/(R_{f,N}^i \times C_{f,N}^i)}\right]} \tag{46}$$

$$K_{RC}(T_{out}) = \text{median}\left\{\frac{f_{RC,D}^1(T_{out})}{f_{RC,N}^1(T_{out})}, \frac{f_{RC,D}^2(T_{out})}{f_{RC,N}^2(T_{out})}, \ldots, \frac{f_{RC,D}^n(T_{out})}{f_{RC,N}^n(T_{out})}\right\} \tag{47}$$

In step S1450, a linear fit $K_Q(T_{out})$ and a polynomial fit $K_{RC}(T_{out})$ are performed.

$$\tilde{K}_Q(T_{out}) = \begin{cases} \tilde{k}_Q \times \min(T_o) + \tilde{b}_Q & \text{if } T_{out} < \min(T_o) \\ \tilde{k}_Q \times T_{out} + \tilde{b}_Q & \text{if } \min(T_o) \leq T_{out} \leq \max(T_o) \\ \tilde{k}_Q \times \max(T_o) + \tilde{b}_Q & \text{if } T_{out} > \max(T_o) \end{cases} \tag{48}$$

$$\tilde{K}_{RC}(T_{out}) = \tag{49}$$
$$\begin{cases} a_0 \times (\min(T_o))^2 + a_1 \times \min(T_o) + a_2 & \text{if } T_{out} < \min(T_o) \\ a_0 \times T_{out}^2 + a_1 \times T_{out} + a_2 & \text{if } \min(T_o) \leq T_{out} \leq \max(T_o) \\ a_0 \times (\max(T_o))^2 + a_1 \times \max(T_o) + a_2 & \text{if } T_{out} > \max(T_o) \end{cases}$$

In step S1460, an Adjusted Decoupled-ETP model is built for each HVAC unit.

$$T_{room}(k+1) = \tag{50}$$

$$\begin{cases} T_{room}(k+1) = T_{out}(k+1) + \tilde{f}_Q(T_{out}) \times \tilde{R}_f \\ -(T_{out}(k) + \tilde{f}_Q(T_{out}(k))) \times \tilde{R}_f - T_{room}(k)) \times & \text{if } u_{ac}(k) = 1 \\ e^{-\Delta t/(\tilde{R}_f \times \tilde{C}_f)} & \text{if } u_{ac}(k) = 0 \\ T_{out}(k) - (T_{out}(k) - T_{room}(k)) \times e^{-\Delta t/\tilde{f}_{RC}(T_{out}(k))} \end{cases}$$

where $u_{ac}(k+1) =$ $$\begin{cases} 1 & \text{if } T_{room}(k+1) < T^- \\ 0 & \text{if } T_{room}(k+1) > T^+, \tilde{R}_f = K_{R_f} \times R_{f,N}, \tilde{C}_f = K_{C_f} \times C_{f,N}, \\ u_{ac}(k) & \text{else} \end{cases}$$

$$\tilde{f}_Q(T_{out}) = \tilde{K}_Q(T_{out}) \times f_{Q,N}(T_{out}), \tilde{f}_{RC}(T_{out}) = \tilde{K}_{RC}(T_{out}) \times f_{RC,N}(T_{out}) \tag{51}$$

$$\hat{f}_Q(T_{out}) = \tilde{K}_Q(T_{out}) \times f_{Q,N}(T_{out}), \hat{f}_{RC}(T_{out}) = \tilde{K}_{RC}(T_{out}) \times f_{RC,N}(T_{out}) \tag{51}$$

The following exemplary algorithm may be used for deriving the Adjusted Decoupled-ETP model according to embodiments described herein.

Exemplary Algorithm 3: Deriving the Adjusted Decoupled-ETP Model

Step 1. Select at least $N_{adj}$ houses data ($P_{ac}(t)$, $T_{out}(t)$) under the same season and repeat Algorithm 1 to select at least $N_S$ single family houses, $N_A$ apartments and $N_T$ townhouses that are capable to derive both Nighttime and Whole-day HVAC models.

Step 2. For each selected single family house i, repeat Algorithm 2 Step 1 through Step 7 to obtain the whole-day Decoupled-ETP model parameters $R_f^D(i)$, $C_f^D(i)$, $Q_f^D(i)$, $f_{RC}^D(T_{out}, i)$, $f_Q^D(T_{out}, i)$, i=1, 2, . . . , $N_S$
and the nighttime Decoupled-ETP model parameters $R_f^N(i)$, $C_f^N(i)$, $Q_f^N(i)$, $f_{RC}^N(T_{out}, i)$, $f_Q^N(T_{out}, i)$, i=1, 2, . . . . $N_S$.

Step 3. Calculate adjustment gain $K_{R_f,S}$, $K_{C_f,S}$, $\tilde{K}_{Q,S}(T_{out})$, $\tilde{K}_{RC,S}(T_{out})$ modified for single family data, s.

$$K_{R_f,S} = \text{median}\left\{\frac{R_f^D(i)}{R_f^N(i)}\right\}, i = 1, 2, \ldots, N_S \tag{52}$$

$$K_{C_f,S} = \text{median}\left\{\frac{C_f^D(i)}{C_f^N(i)}\right\}, i = 1, 2, \ldots, N_S \tag{53}$$

$$\tilde{K}_{Q,S}(T_{out}) = \text{median}\left\{\frac{g_Q^D(T_{out}, i)}{f_Q^N(T_{out}, i)}\right\}, i = 1, 2, \ldots, \tag{54}$$

$$N_S, T_{out} = \min\{T_0(i)\}\min\{T_0(i)\} + 1, \ldots, \max\{T_0(i)\}$$

$$g_Q^D(T_{out}, i) = \frac{(T_0(i) - T^+) \times e^{\frac{-t_{ON}^M(i)}{R_f^N(i) \times C_f^N(i)}} + T^- - T_0(i)}{R(i) \times \left[1 - e^{\frac{-t_{ON}^M(i)}{R_f^N(i) \times C_f^N(i)}}\right]} \tag{55}$$

$$\tilde{K}_{RC,S}(T_{out}) = \text{median}\left\{\frac{f_{RC}^D(T_{out}, i)}{f_{RC}^N(T_{out}, i)}\right\}, i = 1, 2, \ldots, N_S \tag{56}$$

Step 4. Use capped linear and quadratic regression in Equations (38) and (40) to fit the relation between $\tilde{K}_{Q,S}(T_{out})$, $\tilde{K}_{RC,S}(T_{out})$ and $T_{out}$.

$$K_{Q,S}(T_{out}) = \begin{cases} k_{Q,S} \times \min\{T_o(i)\} + b_{Q,S} & \text{if } T_{out} < \min\{T_o(i)\} \\ k_{Q,S} \times T_{out} + b_{Q,S} & \text{if } \min\{T_o(i)\} \leq T_{out} \leq \min\{T_o(i)\} \\ k_{Q,S} \times \max\{T_o(i)\} + b_{Q,S} & \text{if } T_{out} > \max\{T_o(i)\} \end{cases} \quad (57)$$

$$K_{RC,S}(T_{out}) = \begin{cases} k_{R,S,2} \times \min\{T_o(i)\}^2 + k_{R,S,1} \times \min\{T_o(i)\} + b_{R,S} & \text{if } T_{out} < \min\{T_o(i)\} \\ k_{R,S,2} \times T_{out}^2 + k_{R,S,1} \times T_{out} + b_{R,S} & \text{if } \min\{T_o(i)\} \leq T_{out} \leq \min\{T_o(i)\} \\ k_{R,S,2} \times \max\{T_o(i)\}^2 + k_{R,S,1} \times \max\{T_o(i)\} + b_{R,S} & \text{if } T_{out} > \max\{T_o(i)\} \end{cases} \quad (58)$$

Step 5. Repeat Step 2-Step 4 for selected $N_A$ apartments and obtain adjustment gain $K_{R_f,A}$, $K_{C_f,A}$, $K_{Q,A}(T_{out})$, $K_{RC,A}(T_{out})$. Repeat Step 2-Step 4 for selected NT townhouses and obtain adjustment gain $K_{R_f,T}$, $K_{C_f,T}$, $K_{Q,T}(T_{out})$, $K_{RC,T}(T_{out})$.

Step 6. For each house to model, repeat Step 1-Step 7 in Algorithm 2 and build the nighttime decoupled-ETP model with parameters $R_f^N$, $C_f^N$, $Q_f^N$, $f_{RC}^N(T_{out})$, $f_Q^N(T_{out})$. Based on the type of house, select the corresponding adjustment gain $K_{R_f}$, $K_{C_f}$, $K_Q(T_{out})$, $K_{RC}(T_{out})$ obtained in Step 4 through Step 5.

Step 7. Build the Adjusted Decoupled-ETP model using the following.

$$T_{room}(k+1) = T_{out}(k) + f_Q(T_{out}(k)) \times R - \quad (59)$$

$$(T_{out}(k) + f_Q(T_{out}(k)) \times R - T_{room}(k)) \times e^{\frac{-\Delta t}{R \times C}} \text{ if } u_{ac}(k) = 1$$

$$T_{out}(k) - (T_{out}(k) - T_{room}(k)) \times e^{\frac{-\Delta t}{f_{RC}(T_{out}(k))}} \text{ if } u_{ac} = 0 \quad (60)$$

$$R = R_f^N \times K_{R_f} \quad (61)$$

$$C = RC_f^N \times K_{RC_f} \quad (62)$$

$$f_Q(T_{out}) = f_Q^N(T_{out}) \times K_Q(T_{out}) \quad (63)$$

$$f_{RC}(T_{out}) = f_{RC}^N(T_{out}) \times K_{RC}(T_{out}) \quad (64)$$

$$u_{ac}(k+1) = \begin{cases} 1 & \text{if } T_{room}(k+1) < T^- \\ 0 & \text{if } T_{room}(k+1) > T^+ \\ u_{ac}(k) & \text{if } T^- \leq T_{room}(k+1) \leq T^+ \end{cases} \quad (65)$$

Simulation results compared the performance of the ETP model with the Decoupled-ETP model and the Adjusted Decoupled-ETP model. Two performance criteria were used. The first criterion was the error in the measured and estimated total ON time durations and the second is the total number of switchings. The total ON duration reflects the accuracy of the model when estimating the total power consumptions. The total number of switchings indicates the accuracy of the model when estimating the switching behaviors.

The accuracy of the ETP models and the Decoupled-ETP models were verified using House #3192 data and verification results using 100 HVAC units.

Verification Results Using House #3192 Data

Table III shows the results comparing the errors in the total ON time and the total number of switchings when using the ETP model and the Decoupled-ETP model, respectively. APE is defined as the absolute percentage error.

$$APE = \left| \frac{\tilde{x} - x}{x} \right| \quad (66)$$

where x is the actual measurement and $\tilde{x}$ is the estimation using the ETP model or the Decoupled ETP model. As illustrated in Table III, the performance of the Decoupled-ETP model is much better than the ETP model.

TABLE III

Performance Comparison

| House #3192 | Total ON Time | | Total Switchings | |
|---|---|---|---|---|
| | Time (min) | APE | # times | APE |
| Actual | 6788 | NA | 751 | NA |
| ETP Model | 6471 | 4.66% | 702 | 6.52% |
| Decoupled ETP | 6784 | 0.01% | 766 | 2.00% |

Verification Results Using 100 HVAC Units

FIGS. 15A and 15B are bar graphs illustrating a mean absolute percentage error (MAPE) and a standard deviation (SD) of the total ON time based on night time data of one hundred HVAC units. The error distribution is for the ETP or the Decoupled-ETP model based on midnight data. FIGS. 15C and 15D are bar graphs illustrating MAPE and a SD of the total number of switchings of one hundred HVAC units. Table IV also illustrates these results. The results illustrate the total ON time and the total number of switchings of the Decoupled-ETP model have a much lower MAPE and SD than those of the ETP model. The error distribution for the ETP model for ON time APE illustrated in FIG. 15A also confirms that the Decoupled-ETP model for ON time APE illustrated in FIG. 15B performs significantly better than the ETP model and its performance is consistent across the households.

TABLE IV

Performance Comparison Using 100 Houses Data

| 100 Houses | Total ON Time | | Total Switching Times | |
|---|---|---|---|---|
| | MAPE | SD | MAPE | SD |
| ETP Model | 14.52% | 10.55% | 12.69% | 12.56% |
| Decoupled ETP | 4.23% | 3.35% | 3.49% | 2.95% |

The performance of the ETP model, the Decoupled-ETP model, and the Adjusted Decoupled-ETP model was verified using 24-hour whole day data, as illustrated below. The performance of the Adjusted Decoupled-ETP models was verified using House #3456 data and verification results using 50 HVAC units.

Verification Results Using House #3456 Data

Table V illustrates the comparison of errors in the total ON time and the number of switchings for different models.

TABLE V

Results Comparison, House #3456 at Austin, Texas
from 15:18 pm Jul. 12th to 21:57 pm Aug. 2, 2015

| House | Data | Total ON Time | | Total Switchings | |
|---|---|---|---|---|---|
| #3456 | Input | Time (min) | APE | # Times | APE |
| Actual | NA | 5779 | NA | 669 | NA |
| ETP1 | Midnight | 11713 | 102.68% | 946 | 41.30% |
| ETP2 | Whole day | 5487 | 5.05% | 583 | 12.86% |
| Decoupled-ETP1 | Midnight | 6338 | 9.68% | 733 | 9.62% |
| Decoupled-ETP2 | Whole day | 5765 | 0.25% | 335 | 0.10% |
| Adjusted Decoupled-ETP | Midnight | 6152 | 6.46% | 708 | 5.77% |

Column "Data Input" refers to the type of data that was used to build the model. The Whole-day data used the 24-hr consumption of the HVAC unit in house #3456 as inputs and the Night data used 12 a.m. to 5 a.m. HVAC consumption as inputs. The Decoupled-ETP model using the whole-day data as inputs had the best performance with the lowest errors. When the midnight model was used without being adjusted, the modeling error increased sharply. When using the Adjusted Decoupled-ETP model, the error was reduced by close to 50%. The error was defined as the cumulated error of 21 days, the average daily modeling errors in the total ON time were within 18 minutes and the average errors in modeling the number of switches were within two times. This illustrates an improved performance when modeling the HVAC switching characteristics.

Verification of 100 HVAC Units

Table VI and FIGS. 16A through 16F verify the Case 1 results using data collected from fifty houses during summer months. FIGS. 16A and 16B are bar graphs illustrating ON time APE and Switching APE, respectively for the Decoupled-ETP1 model. FIGS. 16C and 16D are bar graphs illustrating ON time APE and Switching APE, respectively for the Decoupled-ETP2 model. FIGS. 16E and 16F are bar graphs illustrating ON time APE and Switching APE, respectively for the Adjusted Decoupled-ETP model. The results show that all three Decoupled-ETP model performances were consistent across households. If only the midnight data is usable, the Adjusted Decoupled-ETP model can be used for modeling the day-time HVAC behaviors.

TABLE VI

Performance Comparison Using 50 Houses Data

| | Data | Total ON Time | | Total Switchings | |
|---|---|---|---|---|---|
| 50 Houses | Input | MAPE | SD | MAPE | SD |
| ETP1 | Midnight | 85.72% | 38.96% | 46.69% | 15.70% |
| ETP2 | Whole day | 9.16% | 7.44% | 8.61% | 7.61% |
| Decoupled-ETP1 | Midnight | 17.84% | 14.73% | 13.07% | 12.77% |
| Decoupled-ETP2 | Whole day | 2.31% | 1.79% | 3.00% | 1.81% |
| Adjusted Decoupled-ETP | Midnight | 8.86% | 7.09% | 7.92% | 6.33% |

Previous systems and methods have attempted to reduce peak power by controlling generators, thermostats, etc. based on a centralized system model, architecture, or configuration. Some systems and methods have modeled uncertainties in aggregated HVAC loads using a state queueing model, wherein no control is involved. Other methods reshape the energy demand profile of aggregated buildings, which is also based on a centralized system design and model. One HVAC aggregated model is based on an ETP model and a centralized control strategy. Other systems and methods use an HVAC load control strategy to follow the targeted load curve, which is based on a centralized multi-objective system model, architecture, or configuration. Still other systems and methods use a state space-based HVAC simulation model based on an ETP model, wherein no control is involved.

In contrast, embodiments herein describe data-driven methods and models to estimate the ETP model parameters of TCAs using their power consumptions and ambient temperature data as inputs. The modeling of HVAC units is used to decouple the modeling of the ON and OFF cycles, which simplifies the derivation of modeling parameters and significantly improves the modeling accuracy. To adjust the distortion of human activities on HVAC cycling behaviors, midnight data is used for ETP model parameter estimation. A tuning process is used to adjust the nighttime models due to the impact of solar radiation.

In one implementation, the functions and processes of the modeling system 100 can be implemented in part by a computer 1700 illustrated in FIG. 17. In particular, power consumption database 120, power ETP model processor 130, power Decoupled-ETP model processor 140, power Adjusted Decoupled-ETP model processor 150, and/or prediction processor 160 can be implemented by the computer 1700, either separately or together as one or more units.

A hardware description of the computer 1700 according to exemplary embodiments is described with reference to FIG. 17. In FIG. 17, the computer 1700 includes a CPU 1701 which performs the processes described herein. The process data and instructions may be stored in memory 1702. These processes and instructions may also be stored on a storage medium disk 1704 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computer 1700 communicates, such as a server or computer.

Further, the claimed advancements may be provided as a utility application, background daemon, or component of an operating system, or combination thereof, executing in conjunction with CPU 1701 and an operating system such as Microsoft® Windows®, UNIX®, Oracle® Solaris, LINUX®, Apple macOS® and other systems known to those skilled in the art.

In order to achieve the computer 1700, the hardware elements may be realized by various circuitry elements, known to those skilled in the art. For example, CPU 1701 may be a Xenon® or Core(processor from Intel Corporation of America or an Opteron® processor from AMD of America, or may be other processor types that would be recognized by one of ordinary skill in the art. Alternatively, the CPU 1701 may be implemented on an FPGA, ASIC, PLD or using discrete logic circuits, as one of ordinary skill in the art would recognize. Further, CPU 1701 may be implemented as multiple processors cooperatively working in parallel to perform the instructions of the inventive processes described above.

The computer 1700 in FIG. 17 also includes a network controller 1706, such as an Intel Ethernet PRO network interface card from Intel Corporation of America, for interfacing with network 1724. As can be appreciated, the network 1724 can be a public network, such as the Internet, or a private network such as LAN or WAN network, or any combination thereof and can also include PSTN or ISDN sub-networks. The network 1724 can also be wired, such as an Ethernet network, or can be wireless such as a cellular network including EDGE, 3G and 4G wireless cellular systems. The wireless network can also be WiFi®, Bluetooth®, or any other wireless form of communication that is known.

The computer 1700 further includes a display controller 1708, such as a NVIDIA® GeForce® GTX or Quadro® graphics adaptor from NVIDIA Corporation of America for interfacing with display 1710, such as a Hewlett Packard® HPL2445w LCD monitor. A general purpose I/O interface 1712 interfaces with a keyboard and/or mouse 1714 as well as an optional touch screen panel 1716 on or separate from display 1710. General purpose I/O interface 1712 also connects to a variety of peripherals 1718 including printers and scanners, such as an OfficeJet® or DeskJet® from Hewlett Packard.

The general purpose storage controller 1720 connects the storage medium disk 1704 with communication bus 1722, which may be an ISA, EISA, VESA, PCI, or similar, for interconnecting all of the components of the computer 1700. A description of the general features and functionality of the display 1710, keyboard and/or mouse 1714, as well as the display controller 1708, storage controller 1720, network controller 1706, and general purpose I/O interface 1712 is omitted herein for brevity as these features are known.

A number of implementations have been described. Nevertheless, it will be understood that various modifications may be made without departing from the spirit and scope of this disclosure. For example, preferable results may be achieved if the steps of the disclosed techniques were performed in a different sequence, if components in the disclosed systems were combined in a different manner, or if the components were replaced or supplemented by other components. The functions, processes, and algorithms described herein may be performed in hardware or software executed by hardware, including computer processors and/or programmable circuits configured to execute program code and/or computer instructions to execute the functions, processes, and algorithms described herein. Additionally, an implementation may be performed on modules or hardware not identical to those described. Accordingly, other implementations arm within the scope that may be claimed.

The foregoing discussion describes merely exemplary embodiments of the present disclosure. As will be understood by those skilled in the art, the present disclosure may be embodied in other specific forms without departing from the spirit or essential characteristics thereof. Accordingly, the disclosure is intended to be illustrative, but not limiting of the scope of the disclosure, as well as the claims. The disclosure, including any readily discernible variants of the teachings herein, defines in part, the scope of the foregoing claim terminology such that no inventive subject matter is dedicated to the public.

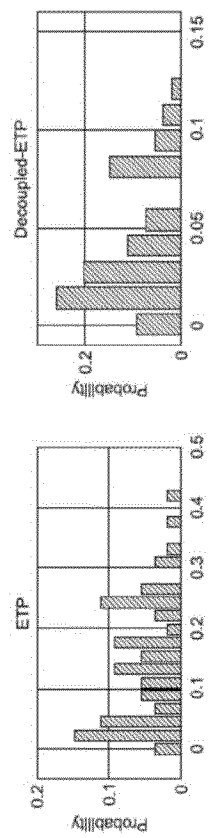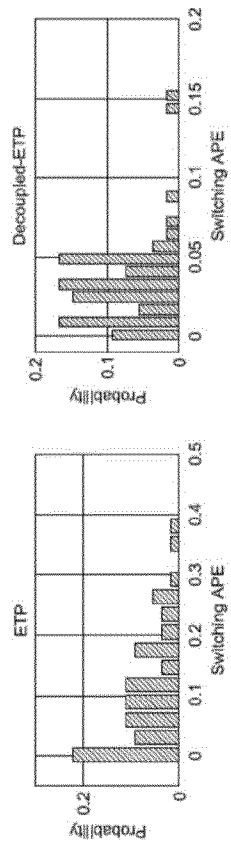

The invention claimed is:

1. A method of improving an energy parameter estimation, comprising:
    storing power consumption data retrieved from a plurality of power systems into a power consumption database;
    converting, via processing circuitry, the power consumption data into power activated time cycles and power non-activated time cycles;
    calculating, via the processing circuitry, median time values of the power activated time cycles and the power non-activated time cycles for respective outdoor temperatures;
    deriving a thermal resistance (R) parameter and a capacitance (C) parameter for a predetermined heat flow (Q) parameter at each of the respective outdoor temperatures for the plurality of power systems;
    comparing, via the processing circuitry, the converted power activated time cycles to the actual power activated time cycles for the plurality of power systems;
    comparing, via the processing circuitry, the converted power non-activated time cycles to the actual power non-activated time cycles for the plurality of power systems;
    calculating a first improved resistance-capacitance-heat flow (RCQ) parameter set and a respective first outdoor temperature for the compared and converted power activated time cycles to the actual power activated time cycles;
    calculating a second improved RCQ parameter set and a respective second outdoor temperature for the compared and converted power non-activated time cycles to the actual power non-activated time cycles; and
    improving the energy parameter estimation by executing the first and second improved RCQ parameter sets at the respective first and second outside temperatures for each of the plurality of power systems, wherein the improving the energy parameter estimation identifies energy efficiencies to reduce a total energy load within said each of the plurality of power systems.

2. The method of claim 1, wherein the improved RCQ parameter set is determined by minimizing an error between the converted power activated time cycles and the actual power activated time cycles, and between the converted power non-activated time cycles and the actual power non-activated time cycles.

3. The method of claim 1, wherein the power consumption data is limited to data within a temperature range between a predefined upper limit temperature and a predefined lower limit temperature.

4. The method of claim 1, wherein the method comprises an equivalent thermal parameter (ETP) model for improving the energy parameter estimation.

5. The method of claim 1, further comprising:
    calculating the Q parameter at each of the respective outdoor temperatures during the power activated time cycles for the plurality of power systems; and
    calculating the R parameter and the C parameter at each of the respective outdoor temperatures during the power non-activated time cycles for the plurality of power systems.

6. The method of claim 5, further comprising:
    calculating, via the processing circuitry, an estimated duration of each of the power activated time cycles from the Q parameter calculated at each of the respective outdoor temperatures;
    calculating, via the processing circuitry, an estimated duration of each of the power non-activated time cycles from the R parameter and the C parameter calculated at each of the respective outdoor temperatures; and
    improving the energy parameter estimation to reduce errors corresponding to variations in said each of the respective outdoor temperatures by decoupling daytime parameters from night time parameters via the estimated duration of said each of the power activated time cycles from the Q parameter and via the estimated duration of said each of the power non-activated time cycles from the R parameter and the C parameter.

7. The method of claim 1, further comprising:
calculating an R adjustment coefficient as a ratio of a whole-day R parameter to a night-time R parameter;
calculating a C adjustment coefficient as a ratio of a whole-day C parameter to a night-time C parameter;
calculating a Q adjustment coefficient at said each of the respective outdoor temperatures as a ratio of a whole-day Q parameter to a night-time Q parameter at said each of the respective outdoor temperatures; and
calculating an RC adjustment coefficient at said each of the respective outdoor temperatures as a ratio of a whole-day RC parameter to a night-time RC parameter at said each of the respective outdoor temperatures, wherein the whole-day R parameter, the whole-day C parameter, the whole-day Q parameter, and the whole-day RC parameter are calculated from data taken over a 24-hour period of time, and
wherein the night-time R parameter, the night-time C parameter, the night-time Q parameter, and the night-time RC parameter are calculated from data taken during an absence of solar exposure.

8. The method of claim 7, further comprising:
calculating a daytime R parameter as a product of the R adjustment coefficient and a night-time optimum R parameter;
calculating a daytime C parameter as a product of the C adjustment coefficient and a night-time optimum C parameter;
calculating a daytime Q parameter as a product of the Q adjustment coefficient and a night-time optimum Q parameter at said each of the respective outdoor temperatures;
calculating a daytime RC parameter as a product of the RC adjustment coefficient and a night-time optimum RC parameter at said each of the respective outdoor temperatures; and
improving the energy parameter estimation to reduce errors corresponding to variations in solar exposure by adjusting night time parameters to be used as daytime parameters via the daytime R parameter, the daytime C parameter, the daytime Q parameter, and the daytime RC parameter.

9. The method of claim 1, wherein the plurality of power systems includes a plurality of thermostatically controlled appliances (TCAs).

10. The method of claim 9, wherein the plurality of TCAs includes a plurality of heating, ventilation, and air conditioning (HVAC) systems, and the power consumption database includes an HVAC consumption database.

11. A decoupled equivalent thermal parameter (ETP) model processor, comprising:
circuitry configured to
store power consumption data retrieved from a plurality of power systems into a power consumption database;
convert the power consumption data into power activated time cycles and power non-activated time cycles;
calculate median time values of the power activated time cycles and the power non-activated time cycles for respective outdoor temperatures;
derive parameters for a thermal resistance (R) parameter and a capacitance (C) parameter for a predetermined heat flow (Q) parameter at each of the respective outdoor temperatures for the plurality of power systems;
compare the converted power activated time cycles to the actual power activated time cycles for the plurality of power systems;
compare the converted power non-activated time cycles to the actual power non-activated time cycles for the plurality of power systems;
calculate a first improved resistance-capacitance-heat flow (RCQ) parameter set and a respective first outdoor temperature for the compared and converted power activated time cycles to the actual power activated time cycles;
calculate a second improved RCQ parameter set and a respective second outdoor temperature for the compared and converted power non-activated time cycles to the actual power non-activated time cycles;
calculate the Q parameter at each of the respective outdoor temperatures during the power activated time cycles for the plurality of power systems; and
calculate the R parameter and the C parameter at each of the respective outdoor temperatures during the power non-activated time cycles for the plurality of power systems.

12. The decoupled ETP model processor of claim 11, wherein the circuitry is further configured to:
calculate an estimated duration of each of the power activated time cycles from the Q parameter calculated at each of the respective outdoor temperatures; and
calculate an estimated duration of each of the power non-activated time cycles from the R parameter and the C parameter calculated at each of the respective outdoor temperatures,
wherein the calculated Q parameter, the calculated R parameter, and the calculated C parameter improve energy parameter estimation to reduce errors corresponding to variations in said each of the respective outdoor temperatures by decoupling daytime parameters from night time parameters via the estimated duration of said each of the power activated time cycles from the Q parameter and via the estimated duration of said each of the power non-activated time cycles from the R parameter and the C parameter.

13. The decoupled ETP model processor of claim 11, wherein the improved RCQ parameter set is determined by minimizing an error between the converted power activated time cycles and the actual power activated time cycles, and between the converted power non-activated time cycles and the actual power non-activated time cycles.

14. The decoupled ETP model processor of claim 11, wherein the plurality of power systems includes a plurality of thermostatically controlled appliances (TCAs).

15. An adjusted decoupled equivalent thermal parameter (ETP) model processor, comprising:
circuitry configured to
store power consumption data retrieved from a plurality of power systems into a power consumption database;
convert the power consumption data into power activated time cycles and power non-activated time cycles;
calculate median time values of the power activated time cycles and the power non-activated time cycles for respective outdoor temperatures;
derive parameters for a thermal resistance (R) parameter and a capacitance (C) parameter for a predetermined heat flow (Q) parameter at each of the respective outdoor temperatures for the plurality of power systems;
compare the converted power activated time cycles to the actual power activated time cycles for the plurality of power systems;
compare the converted power non-activated time cycles to the actual power non-activated time cycles for the plurality of power systems;
calculate a first improved resistance-capacitance-heat flow (RCQ) parameter set and a respective first outdoor temperature for the compared and converted power activated time cycles to the actual power activated time cycles;
calculate a second improved RCQ parameter set and a respective second outdoor temperature for the compared and converted power non-activated time cycles to the actual power non-activated time cycles;
calculate an R adjustment coefficient as a ratio of a whole-day R parameter to a night-time R parameter;
calculate a C adjustment coefficient as a ratio of a whole-day C parameter to a night-time C parameter;
calculate a Q adjustment coefficient at the respective outdoor temperature as a ratio of a whole-day Q parameter at the respective outdoor temperature to a night-time Q parameter at the respective outdoor temperature; and
calculate an RC adjustment coefficient at the respective outdoor temperature as a ratio of a whole-day RC parameter at the respective outdoor temperature to a night-time RC parameter at the respective outdoor temperature.

16. The adjusted decoupled ETP model processor of claim 15, wherein the circuitry is further configured to:
calculate a daytime R parameter as a product of the R adjustment coefficient and a night-time optimum R parameter;
calculate a daytime C parameter as a product of the C adjustment coefficient and a night-time optimum C parameter;
calculate a daytime Q parameter as a product of the Q adjustment coefficient and a night-time optimum Q parameter at the respective outdoor temperature; and
calculate a daytime RC parameter as a product of the RC adjustment coefficient and a night-time optimum RC parameter at said each of the respective outdoor temperatures,
wherein the calculated daytime R parameter, the calculated daytime C parameter, the calculated daytime Q parameter, and the calculated daytime RC parameter improve energy parameter estimation to reduce errors corresponding to variations in solar exposure by adjusting night time parameters to be used as daytime parameters.

17. The adjusted decoupled ETP model processor of claim 15, wherein the whole-day R parameter, the whole-day C parameter, the whole-day Q parameter, and the whole-day RC parameter are calculated from data taken over a 24-hour period of time, and
wherein the night-time R parameter, the night-time C parameter, the night-time Q parameter, and the night-time RC parameter are calculated from data taken during an absence of solar exposure.

18. The adjusted decoupled ETP model processor of claim 15, wherein the improved RCQ parameter set is determined by minimizing an error between the converted power activated time cycles and the actual power activated time cycles, and between the converted power non-activated time cycles and the actual power non-activated time cycles.

19. The adjusted decoupled ETP model processor of claim 15, wherein the plurality of power systems includes a plurality of thermostatically controlled appliances (TCAs).

20. The adjusted decoupled ETP model processor of claim 19, wherein the plurality of TCAs includes a plurality of heating, ventilation, and air conditioning (HVAC) systems, and the power consumption database includes an HVAC consumption database.

\* \* \* \* \*

UNITED STATES PATENT AND TRADEMARK OFFICE
CERTIFICATE OF CORRECTION

PATENT NO. : 11,514,537 B2  
APPLICATION NO. : 16/754267  
DATED : November 29, 2022  
INVENTOR(S) : Jian Lu et al.

Page 1 of 20

It is certified that error appears in the above-identified patent and that said Letters Patent is hereby corrected as shown below:

In the Drawings

Replace Fig. 1A, and on the title page, the illustrative print Fig. 1A, as shown on the attached drawing sheet 1 of 19
Replace Fig. 1B, and on the title page, the illustrative print Fig. 1B, as shown on the attached drawing sheet 2 of 19
Replace Fig. 2 as shown on the attached drawing sheet
Replace Figs. 3A, 3B, and 3C as shown on the attached drawing sheet
Replace Fig. 4 as shown on the attached drawing sheet
Replace Fig. 5 as shown on the attached drawing sheet
Replace Figs. 6A, 6B, and 6C as shown on the attached drawing sheet
Replace Figs. 7A and 7B as shown on the attached drawing sheet
Replace Fig. 8 as shown on the attached drawing sheet
Replace Figs. 9A and 9B as shown on the attached drawing sheet
Replace Fig. 10 as shown on the attached drawing sheet
Replace Fig. 11 as shown on the attached drawing sheet
Replace Figs. 12A and 12B as shown on the attached drawing sheet
Replace Figs. 13A and 13B as shown on the attached drawing sheet
Replace Fig. 14 as shown on the attached drawing sheet
Replace Figs. 15A, 15B, 15C, and 15D as shown on the attached drawing sheet
Replace Figs. 16A, 16B, and 16C as shown on the attached drawing sheet
Replace Figs. 16D, 16E, and 16F as shown on the attached drawing sheet
Replace Fig. 17 as shown on the attached drawing sheet Signed and Sealed this
First Day of July, 2025

Coke Morgan Stewart
*Acting Director of the United States Patent and Trademark Office*